(12) United States Patent
Yasuhara et al.

(10) Patent No.: US 6,552,389 B2
(45) Date of Patent: Apr. 22, 2003

(54) OFFSET-GATE-TYPE SEMICONDUCTOR DEVICE

(75) Inventors: Norio Yasuhara, Kawasaki (JP); Syotaro Ono, Yokohama (JP); Kazutoshi Nakamura, Yokohama (JP); Yusuke Kawaguchi, Miura-gun (JP); Shinichi Hodama, Yokohama (JP); Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/013,874

(22) Filed: Dec. 13, 2001

(65) Prior Publication Data

US 2002/0100951 A1 Aug. 1, 2002

(30) Foreign Application Priority Data

Dec. 14, 2000 (JP) ........................................ 2000-380094
Sep. 18, 2001 (JP) ........................................ 2001-283974

(51) Int. Cl.[7] .............................................. H01L 29/76
(52) U.S. Cl. ........................................ 257/335; 257/339
(58) Field of Search ................................ 257/145, 242, 257/287, 301, 327, 330, 335, 341, 336, 343, 339, 382, 383, 389, 342, 397, 394, 374, 302, 328, 621, 338, 337, 487, 488, 489, 490, 491, 492, 493, 494, 495, 496

(56) References Cited

U.S. PATENT DOCUMENTS 5,760,440 A    6/1998  Kitamura et al.
5,869,875 A  * 2/1999  Hebert

FOREIGN PATENT DOCUMENTS

| JP | 4-18762 | 1/1992 |
| JP | 5-121739 | 5/1993 |
| JP | 6-97447 | 4/1994 |
| JP | 8-227998 | 9/1996 |

OTHER PUBLICATIONS

Isao Yoshida, et al., "Highly Efficient 1.5GHz Si Power MOSFET for Digital Cellular Front End", Proceedings of 1992 International Symposium on Power Semiconductor Devices & ICs, Tokyo, pp. 156–157.

Shuming XU, et al., "RF LDMOS with Extreme Low Parasitic Feedback Capacitance and High Hot–Carrier Immunity", TECH. DIG. International Electron Devices Meeting, 1999, pp. 201–204.

M. Shindo, et al., "High Power LDMOS for Cellular Base Station Applications", Proceedings of 2001 International Symposium on Power Semiconductor Devices & ICs, Osaka, pp. 107–110.

Malay Trivedi, et al., "Comparison of RF Performance of Vertical and Lateral DMOSFET", Proceedings of the 11th International Symposium on Power Semiconductor Devices and ICs, 1999, pp. 245–248.

* cited by examiner

Primary Examiner—Nathan J. Flynn
Assistant Examiner—Kevin Quinto
(74) Attorney, Agent, or Firm—Oblon, Spivak, McClelland, Maier & Neustadt, P.C.

(57) ABSTRACT

A semiconductor device includes a first semiconductor region having a first conductivity type, a second semiconductor region formed on the first semiconductor region and having the first conductivity type, a third semiconductor region formed in a surface of the second semiconductor region and having a second conductivity type, a fourth semiconductor region formed in the surface of the second semiconductor region and having the second conductivity type, and a gate structure formed on the second and fourth semiconductor region. The semiconductor device further includes a conductive member arranged in the trench extending from a surface of the fourth semiconductor region to the first semiconductor region, the trench having one sidewall surface flush with a sidewall surface of the gate structure.

12 Claims, 30 Drawing Sheets

OFFSET-GATE-TYPE SEMICONDUCTOR DEVICE

CROSS-REFERENCE TO RELATED APPLICATIONS

This application is based upon and claims the benefit of priority from the prior Japanese Patent Applications No. 2000-380094, filed Dec. 14, 2000; and No. 2001-283974, filed Sep. 18, 2001, the entire contents of both of which are incorporated herein by reference.

BACKGROUND OF THE INVENTION

1. Field of the Invention

The present invention relates to a semiconductor device and, more particularly, to a semiconductor device for synchronous commutation, which executes high-frequency operation.

2. Description of the Related Art

A low-ON-resistance characteristic has conventionally been regarded as important for a DC/DC synchronous buck converter used in a computer or the like to improve the efficiency. For this reason, a trench-gate-type MOS transistor has widely been used to form a DC/DC converter. However, along with the recent rise in operation frequency, not only a low ON resistance but also a decrease in switching loss is required. Hence, it is important for a MOS transistor of a DC/DC converter to decrease not only the resistance but also the capacitance. From this viewpoint, a trench-gate-type MOS transistor is not preferable because of its structure in which a gate electrode opposes a drain layer via a thin gate insulating film. With this structure, the area can hardly be reduced, and therefore, the parasitic capacitance between the gate and the drain is large.

In place of a trench-gate-type MOS transistor, an offset-gate-type MOS transistor has begun to be used to form a DC/DC converter. The structure of a conventional offset-gate-type MOS transistor usable for a DC/DC converter has been proposed in, e.g., Malay Trivedi et al., "Comparison of RF Performance of Vertical and Lateral DMOSFET", ISPSD99, Proceedings, pp. 245–248. Jpn. Pat. Appln. KOKAI Publication No. 5-121739 also discloses an insulated gate semiconductor device. As an example, the structure proposed by Malay et al. is shown in FIG. 1. FIG. 1 is a sectional view of a MOS transistor.

As shown in FIG. 1, an $n^+$-type source region 12, n-type LDD region 13, $n^+$-type drain region 14, and p-type body region 15 are formed in the surface region of a $p^-$-type epitaxially grown layer 11 on a $p^+$-type substrate 10. A gate electrode 16 is formed on the body region 15 between the source region 12 and the LDD region 13. A source electrode 17 is formed on the source region and body region 15. A drain electrode 18 is formed on the drain region 14. A reach through layer 19 is formed to connect the source electrode 17 and substrate 10. A source electrode 20 is formed on the lower surface of the substrate 10.

According to the above-described structure, the source electrode 20 can be formed on the lower surface of the substrate 10 by preparing the reach through layer 19. For this reason, the parasitic capacitance or parasitic inductance of the MOS transistor can be reduced. As a consequence, the MOS transistor can have a low resistance and can be operated at a high frequency.

However, the reach through layer 19 is most generally formed by impurity diffusion. Hence, the width of the reach through layer 19 is inevitably relatively large. In some cases, the reach through layer 19 occupies about ½ the area of the entire MOS transistor. For this reason, when the reach through layer 19 is formed, the size of the MOS transistor becomes large.

In actual manufacturing, the gate electrode 16 and source electrode 17 must be separated by a relatively large distance. This is because the misalignment of masks to be used to form the gate and source electrodes is taken into consideration. Then, the width of the body region 15 immediately under the source region 12 increases. Hence, the resistance value of the p-type body region with respect to holes becomes large, and the ruggedness to avalanche current of the MOS transistor deteriorates.

Additionally, the drain interconnection layer is normally located on the gate electrode 16. The gate electrode 16 is adjacent to the drain electrode 18 in the horizontal direction and to the drain interconnection layer in the vertical direction. As a result, the feedback capacitance of the MOS transistor increases.

BRIEF SUMMARY OF THE INVENTION

A semiconductor device according to an aspect of the present invention comprises:

a first semiconductor region having a first conductivity type;

a second semiconductor region formed on the first semiconductor region and having the first conductivity type and a resistance higher than the first semiconductor region;

a conductive member arranged in a trench formed in the second semiconductor region and having a depth from a surface of the second semiconductor region to the first semiconductor region;

a third semiconductor region formed in the surface of the second semiconductor region while being separated from the conductive member and having a second conductivity type;

a fourth semiconductor region formed in the surface of the second semiconductor region in a region between the conductive member and the third semiconductor region and having the second conductivity type, the fourth semiconductor region being in contact with the conductive member and being separated from the third semiconductor region; and a gate structure formed on the fourth semiconductor region and on the second semiconductor region between the third and fourth semiconductor regions, the gate structure having one sidewall surface flush with a sidewall surface of the trench.

A semiconductor device according to other aspect of the present invention comprises:

a first semiconductor region having a first conductivity type;

second and third semiconductor regions formed in a surface of the first semiconductor region and having a second conductivity type, the second and third semiconductor regions being separated from each other;

a gate insulating film formed on the first semiconductor region between the second and third semiconductor regions;

a gate electrode formed on the gate insulating film;

first and second electrodes formed on the second and third semiconductor regions, respectively;

a dielectric interlayer formed on the first semiconductor region to cover at least the second electrode and gate electrode;

an interconnection layer formed on the dielectric interlayer immediately above at least the gate electrode and electrically connected to the first electrode; and a first conductive film formed in the dielectric interlayer immediately above the gate electrode while being separated from the gate electrode and interconnection layer and having the same potential as that of the second electrode or a predetermined potential between the first and second electrodes.

Further, a method for fabricating a semiconductor device according to other aspect of the present invention comprises:

forming a second semiconductor region having a first conductivity type and a resistance higher than a first semiconductor region on the first semiconductor region having the first conductivity type;

forming a gate insulating film on the second semiconductor region;

forming a gate electrode on the gate insulating film;

implanting an impurity having a second conductivity type into the second semiconductor region using the gate electrode as a mask to form a third semiconductor region having the second conductivity type in a surface of the second semiconductor region;

forming an insulating film on the second semiconductor region to cover the gate electrode;

removing a partial region of the insulating film on the gate electrode;

patterning the gate electrode using the insulating film as a mask to form an opening portion reaching the gate insulating film in a partial region of the gate electrode;

implanting the impurity having the second conductivity type from the opening portion into the second semiconductor region to form the fourth semiconductor region having the second conductivity type in the surface of the second semiconductor region, the fourth semiconductor region being separated from the third semiconductor region;

removing the second and fourth semiconductor regions immediately under the opening portion using the insulating film and gate electrode as a mask to form a trench extending to the first semiconductor region through the second and fourth semiconductor regions; and filling the trench with a conductive member.

DETAILED DESCRIPTION OF THE INVENTION

Figure 1:
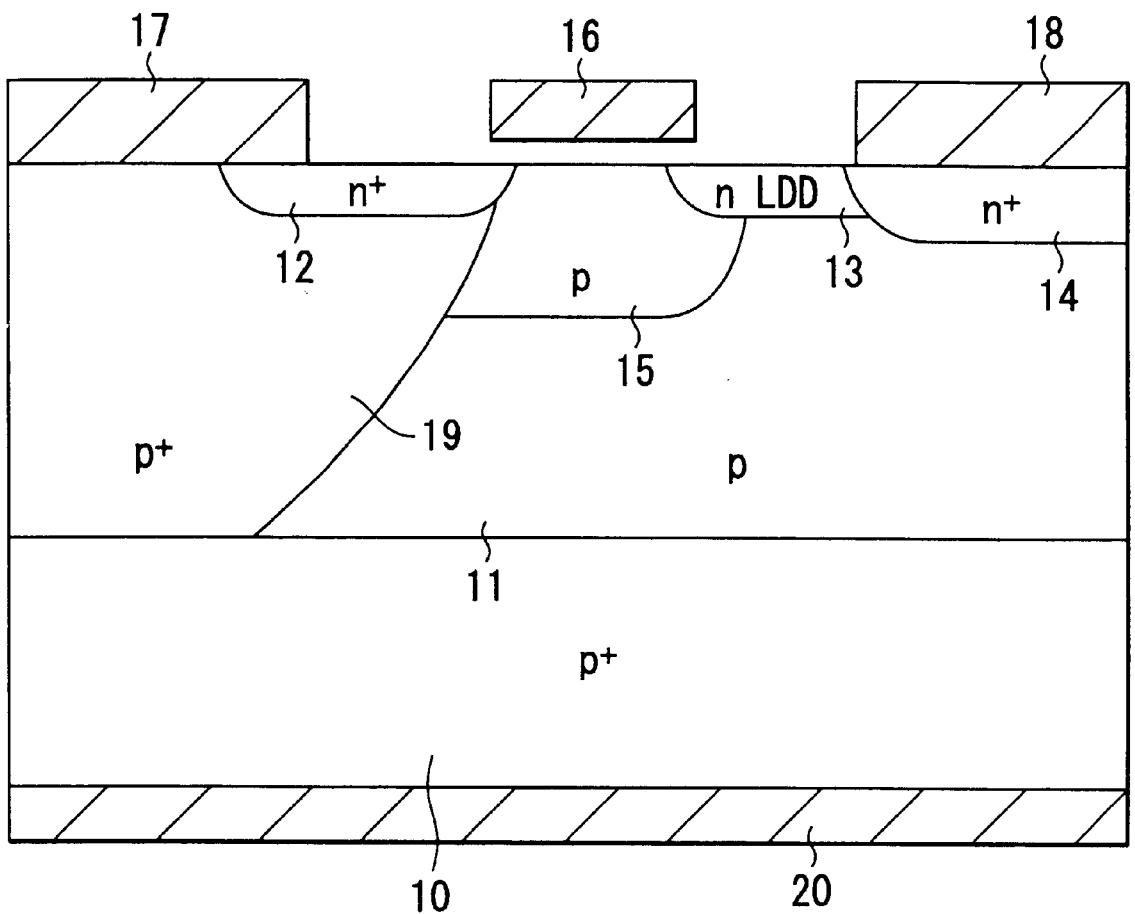
FIG. 1 is a sectional view of a conventional MOS transistor.
Figure 2:
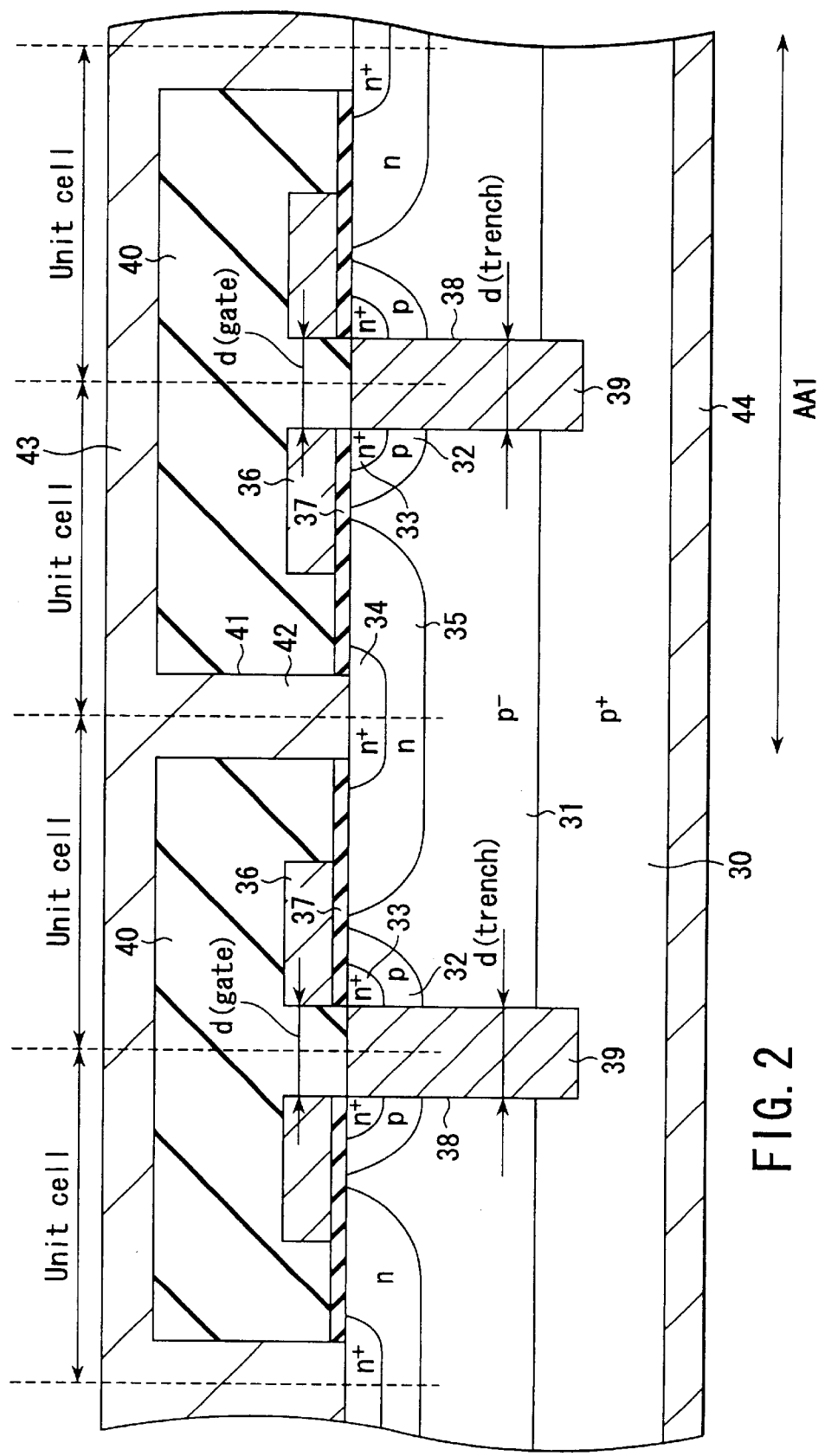
FIG. 2 is a sectional view of a MOS transistor according to the first embodiment of the present invention.

FIG. 2 is a sectional view of a MOS transistor according to the first embodiment of the present invention. FIG. 2 especially shows the sectional structure of an offset-gate-type MOS transistor.

As shown in FIG. 2, a $p^-$-type epitaxially grown layer 31 is formed on a $p^+$-type silicon substrate 30. P-type body regions 32 are selectively formed in the surface region of the $p^-$-type epitaxially grown layer 31. An $n^+$-type source region 33 is selectively formed in the surface region of each body region 32. An $n^+$-type drain region 34 is selectively formed in the surface region of the epitaxial layer 31 between the adjacent body regions 32. An n-type drift region 35 is formed in the surface region of the epitaxially grown layer 31 to surround each n+-type drain region 34 while being separated from the body regions 32. A gate insulating film 37 is formed on each body region 32 and epitaxially grown layer 31 between the source region 33 and the drift region 35. A gate electrode is formed on the gate insulating film 37. Trenches 38 extending from the surfaces of the source regions 33 between the adjacent gate electrodes 36 to the silicon substrate 30 are formed in the epitaxially grown layer 31. Each trench 38 is filled with a conductive member 39. Each trench 38 has an opening width d (trench) substantially equal to a distance d (gate) between the adjacent gate electrodes 36. In addition, the extended surface of the inner wall of each trench is flush with the extended surface of one side surface of each gate electrode 36. A dielectric interlayer 40 is formed on the silicon substrate 30 to cover the gate electrodes 36 and conductive members 39. Contact holes 41 reaching the drain regions 34 are formed in the dielectric interlayer 40. A drain electrode 42 is buried in each contact hole 41. A drain interconnection layer 43 electrically connected to the drain electrodes 42 is formed on the dielectric interlayer 40. A source electrode 44 is formed on the lower surface of the silicon substrate 30.

The MOS transistor according to this embodiment has the above-described structure. A power MOS transistor includes a number of unit cells having the above structure to increase the channel width, thereby enabling large current operation.

A method of manufacturing the MOS transistor according to this embodiment will be described next with reference to FIGS. 3A to 3I. FIGS. 3A to 3I are sectional views sequentially showing the steps in manufacturing the offset-gate-type MOS transistor. FIGS. 3A to 3I especially show a region AAl (a region including two unit cells) in FIG. 2.

Figure 3A:
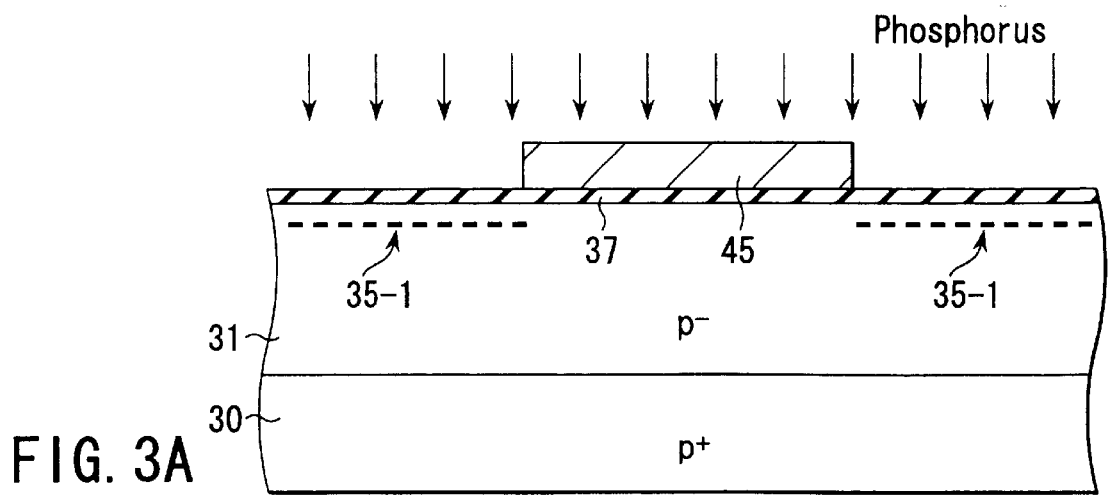
FIGS. 3A to 3I are sectional views sequentially showing the steps in manufacturing the MOS transistor according to the first embodiment of the present invention.

First, as shown in FIG. 3A, the p⁻-type silicon layer 31 having a thickness of about 3 $\mu$m is formed on the upper surface of the p+-type silicon substrate 30 by epitaxial growth. The gate insulating film 37 such as a silicon dioxide film having a thickness of about 30 nm is formed on the epitaxially grown layer 31. A polysilicon film 45 having a thickness of about 0.4 $\mu$m is formed on the gate insulating film 37. An impurity such as phosphorus is implanted into the polysilicon film 45 by, e.g., vapor phase diffusion to reduce the resistance. The polysilicon film 45 is finally formed into gate electrodes. A resist pattern is formed on the polysilicon film 45 by photolithography. The polysilicon film 45 is patterned using the resist pattern as a mask. In addition, phosphorus-implanted layers 35-1 are formed by ion-implanting an n-type impurity such as phosphorus into the epitaxially grown layer 31 to form the n-type drift regions 35, thereby obtaining the structure shown in FIG. 3A.

Figure 3B:
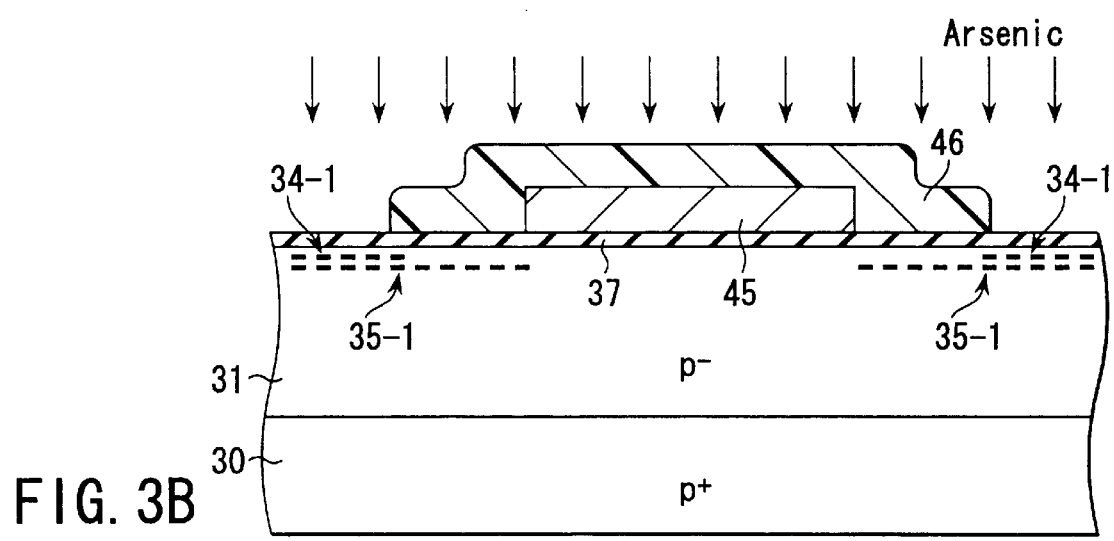

As shown in FIG. 3B, a resist 46 is applied to the polysilicon film 45 and gate insulating film 37. The resist 46 is patterned such that opening portions are formed in regions where the drain regions 34 are to be formed. An n-type impurity such as arsenic to form the n+-type drain regions 34 is ion-implanted into the epitaxially grown layer 31 using the resist 46 as a mask, thereby forming arsenic-implanted layers 34-1. After that, the resist 46 is ashed and removed by the $O_2$-ashing method.

Figure 3C:
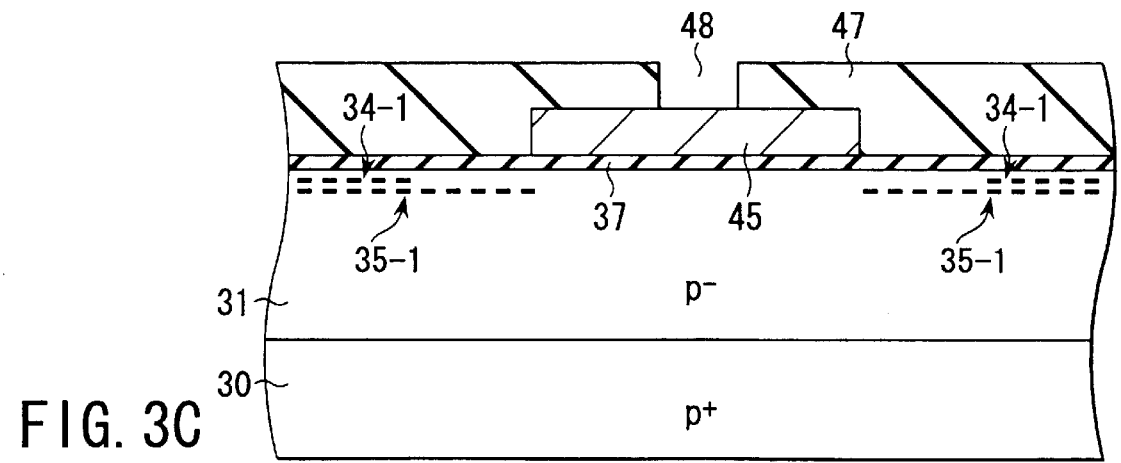

As shown in FIG. 3C, an insulating film 47 such as a silicon dioxide film having a thickness of about 1.0 $\mu$m is formed on the polysilicon film 45 and gate insulating film 37 by CVD (Chemical Vapor Deposition). An insulating film at a portion corresponding to a region where the trench 38 is to be formed between adjacent gate electrodes is removed by photolithography and etching, thereby forming an opening portion 48. The opening width of the opening portion 48 is, e.g., about 0.5 $\mu$m.

Figure 3D:
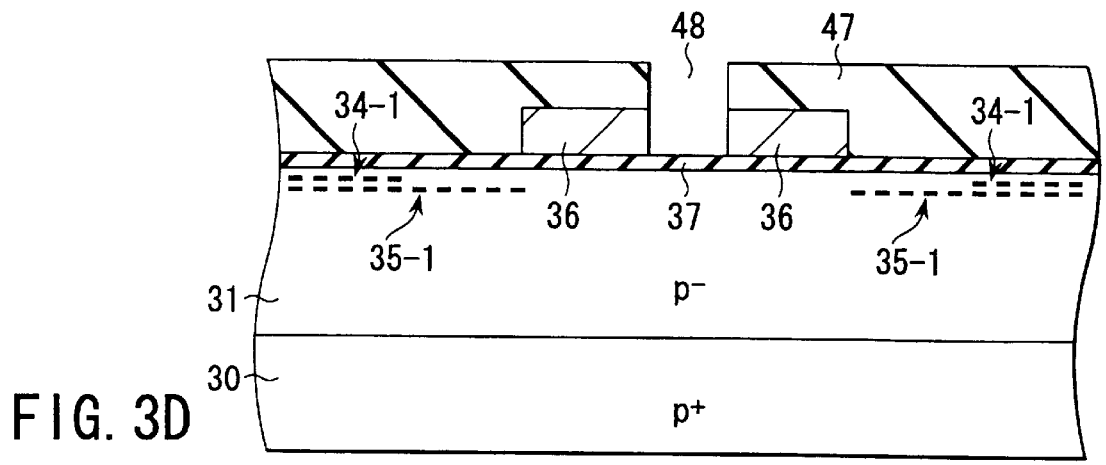

Next, the polysilicon film 45 is etched by RIE (Reactive Ion Etching) using, e.g., $Cl_2$ gas. At this time, the insulating film 47 functions as a mask. As a result, the gate electrodes 36 are formed, as shown in FIG. 3D.

Figure 3E:
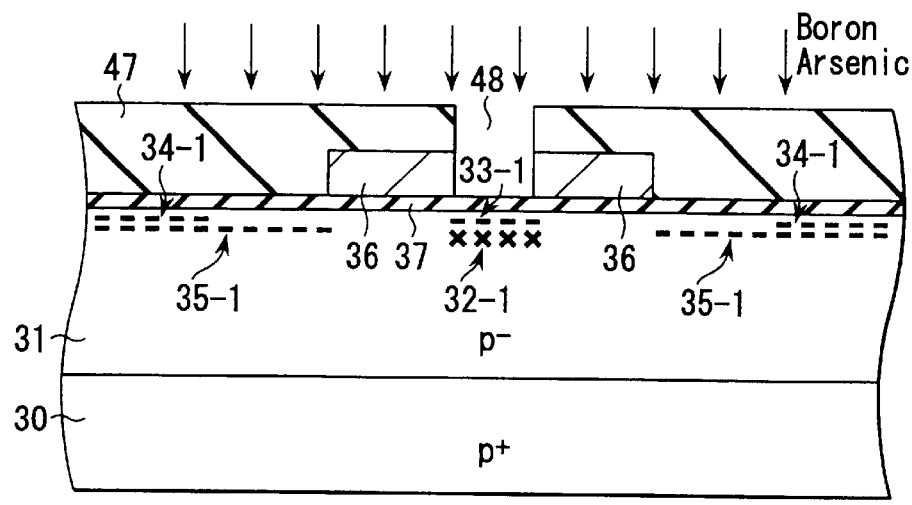

As shown in FIG. 3E, a p-type impurity such as boron to form the p-type body region 32 and an n-type impurity such as arsenic to form the n+-type source region 33 are ion-implanted into the epitaxially grown layer 31 using the insulating film 47 as a mask, thereby forming a boron-implanted layer 32-1 and arsenic-implanted layer 33-1.

Figure 3F:
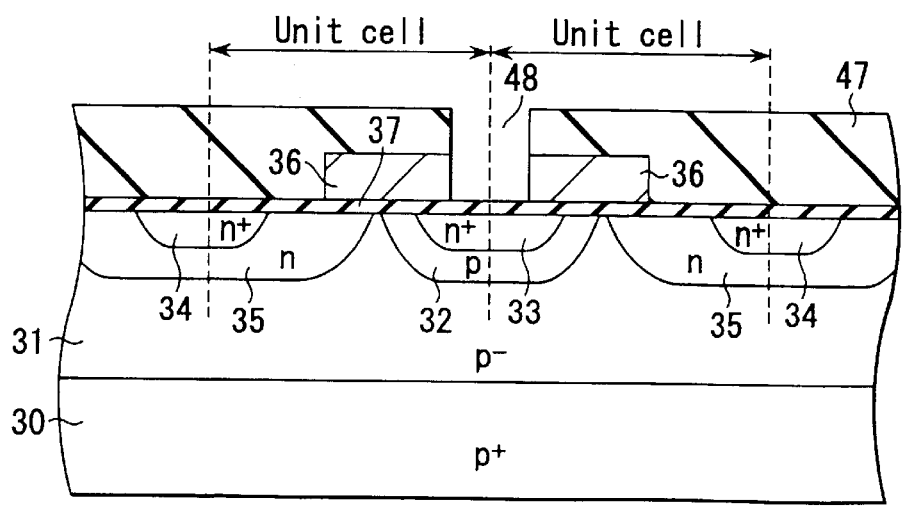

Next, annealing is executed at a temperature of about 1,000° C. to diffuse the impurities in the implanted layers 32-1 to 35-1. Consequently, the p-type body region 32, n+-type source region 33, n+-type drain regions 34, and n-type drift regions 35 are completed, as shown in FIG. 3F.

Figure 3G:
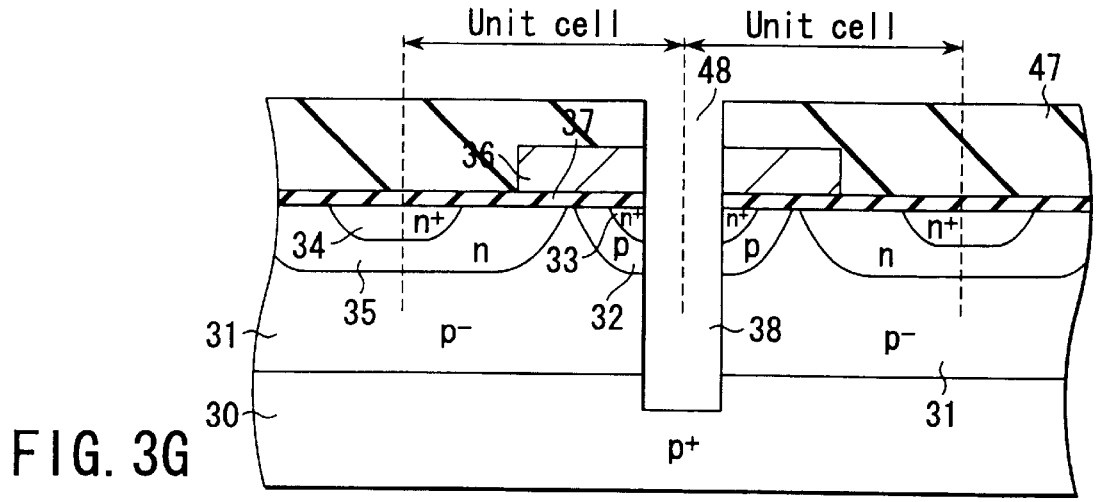

Subsequently, as shown in FIG. 3G, using the gate electrodes 36 and insulating film 47 as an etching mask, the gate insulating film 37 between the adjacent gate electrodes 36 is removed by RIE using a gas mixture of $CHF_3$ and $SF_6$ or a gas mixture of $CF_4$ and $H_2$. if both the gate insulating film 37 and insulating film 47 are formed from silicon dioxide films, both films are etched. Hence, the insulating film 47 must have an extra thickness in advance. In addition, the epitaxially grown layer 31 is etched by RIE using HBr or $SF_6$ gas to form the trench 38 extending from the surface of the source region 33 to the p+-type silicon substrate 30 through the source region 33 and body region 32. At this time as well, the gate electrodes 36 and insulating film 47 function as an etching mask. Hence, the opening width of the trench 38 substantially equals the distance between the adjacent gate electrodes 36 and is, e.g., about 0.5 $\mu$m.

Figure 3H:
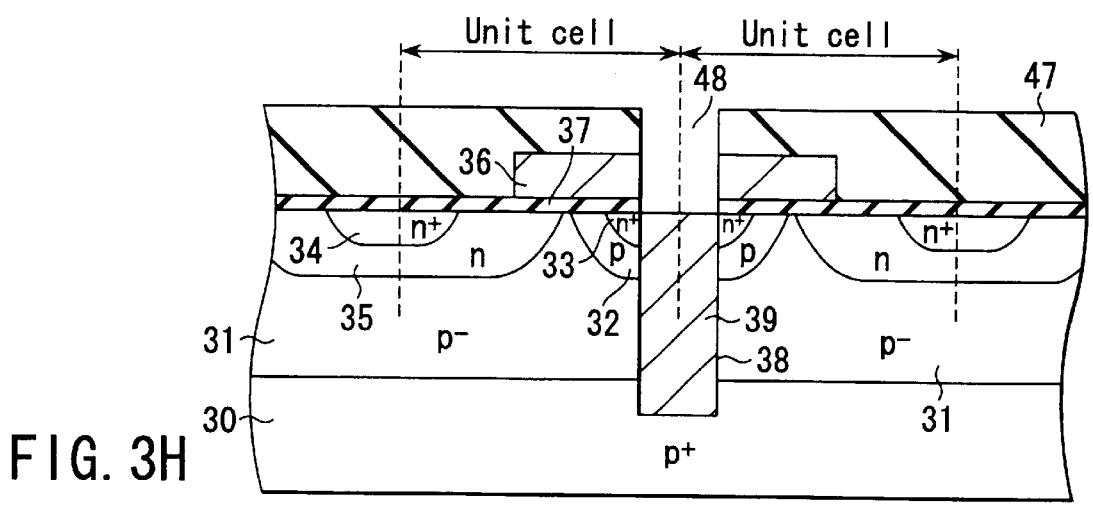

The conductive member 39 made of, e.g., tungsten (W) is formed on the insulating film 47 and in the trench 38. The conductive member 39 on the insulating film 47 and in the opening portion 48 is etched back by CDE (Chemical Dry Etching), thereby obtaining a structure in which the conductive member 39 remains only in the trench 38, as shown in FIG. 3H. To prevent any electrical short circuit between the conductive member 39 and the gate electrodes 36, etch back must be executed such that the upper end portion of the conductive member 39 is at a lower level than the bottom surface of each gate electrode 36. If tungsten is to be buried into the trench 38, a thin barrier metal film of, e.g., TiN is preferably formed on the inner wall of the trench 38 before deposition of tungsten. This improves the contact between tungsten and silicon.

Figure 3I:
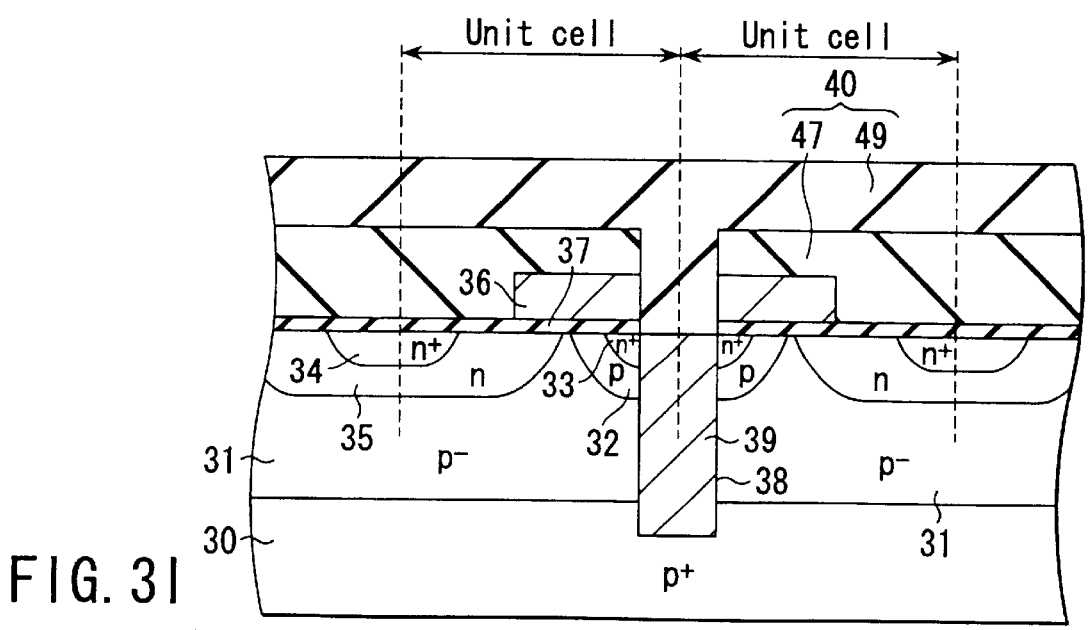

Next, as shown in FIG. 3I, an insulating film 49 such as a silicon dioxide film is formed in the opening portion 48 between the adjacent gate electrodes 36 and on the insulating film 47. The insulating films 47 and 49 form the dielectric interlayer 40.

After that, the contact hole 41 reaching the drain region 34 is formed in the dielectric interlayer 40 by photolithography and etching. The drain electrode 42 connected to the drain region 34 by ohmic contact is formed in the contact hole 41. The source electrode 44 is formed on the lower surface of the silicon substrate 30. The drain interconnection layer 43 is formed on the dielectric interlayer 40. Thus, the MOS transistor shown in FIG. 2 is completed.

According to the MOS transistor having the above structure, the following effects are obtained.

(1) The MOS transistor size can be reduced.

In the MOS transistor having the structure shown in FIG. 2, the source region 33 and silicon substrate 30 are electrically connected by the conductive member 39 buried in the trench 38 (the structure including the trench 38 and conductive member 39 will be referred to as a trench electrode hereinafter). In addition, the opening width d (trench) of the trench 38 substantially equals the distance d (gate) between the adjacent gate electrodes 36. In other words, each gate electrode 36 is laid out to be adjacent to the trench 38 such that the extended surface of one side surface becomes flush with the extended surface of the inner wall of the trench 38. The other side surface of each gate electrode 36 extends onto the surface of the corresponding n-type drift region 35. In the prior art, when a reach through layer is used to connect a source region and silicon substrate, the reach through layer becomes as wide as about 10 μm. This is because the reach through layer is formed by impurity diffusion. However, according to this embodiment, the source region and silicon substrate are electrically connected by the trench electrode. The size of the trench electrode is determined by etching such as RIE in forming the trench 38. Hence, the trench width can be formed as small as about 0.5 to 1 μm or up to the exposure limit wavelength. As a result, the MOS transistor size can be greatly reduced. For example, the area of a conventional power MOS transistor including a plurality of MOS transistors is about 6 mm². With the structure according to this embodiment, the area decreases to about 4 mm². That is, the occupied area can be decreased by about 30%.

(2) The ruggedness to avalanche current of the MOS transistor can be improved.

The trench electrode is arranged in the vicinity of each gate electrode 36. A side surface of the trench electrode matches one side surface of the corresponding gate electrode 36. For this reason, the area of the source region 33 also becomes smaller than the prior art. Since the area of the body region 32 immediately under the source region 33 also becomes small, the resistance value of the body region 32 with respect to holes flowing at that portion in the horizontal direction becomes considerably small. Hence, the ruggedness to avalanche current of the MOS transistor can be improved.

(3) The MOS transistor assembly step can be simplified.

As described above, the source electrode 44 is formed on the lower surface of the silicon substrate 30. Hence, the MOS transistor is assembled such that the source electrode 44 comes into contact with the upper surface of an assembly substrate. That is, instead of wire-bonding the source electrode 44 to an interconnection surface of the assembly substrate which supplies a source potential, the surface of the source electrode 44 is directly bonded to the interconnection surface. Hence, the problem of a parasitic inductance generated by bonding wires can be solved. In addition, the assembly step can be simplified. Furthermore, since the source electrode 44 is formed on the lower surface of the silicon substrate 30, the resistance of the MOS transistor can be decreased.

(4) Manufacturing process is facilitated.

According to the above manufacturing method, the trench 38 is formed using the insulating film 47 and gate electrodes 36 as a mask. Hence, the inner wall of the trench 38 self-aligns with one side surface of each gate electrode 36. Hence, the structure can easily be implemented.

In the above embodiment, tungsten is used as the material of the conductive member 39. The tungsten can be formed by, e.g., blanket-CVD or selective growth. Tungsten is most preferably used to fill the trench 38 because tungsten has an excellent filling characteristic for the trench and is hardly be affected by high-temperature treatment such as gettering in the post-process. The filling material of the trench is not limited to tungsten. Any other material that has a resistance lower than the p⁻-type epitaxially grown layer 31 can be used. Especially, a refractory metal is preferably used. Not a metal but a polycrystalline semiconductor heavily doped with a p-type impurity may be used. When a polycrystalline semiconductor is used, a metal electrode must be partially formed at the interface between the semiconductor member and the n⁺-type source region 33 to short-circuit the semiconductor member to the n⁺-type source region 33.

Figure 4:
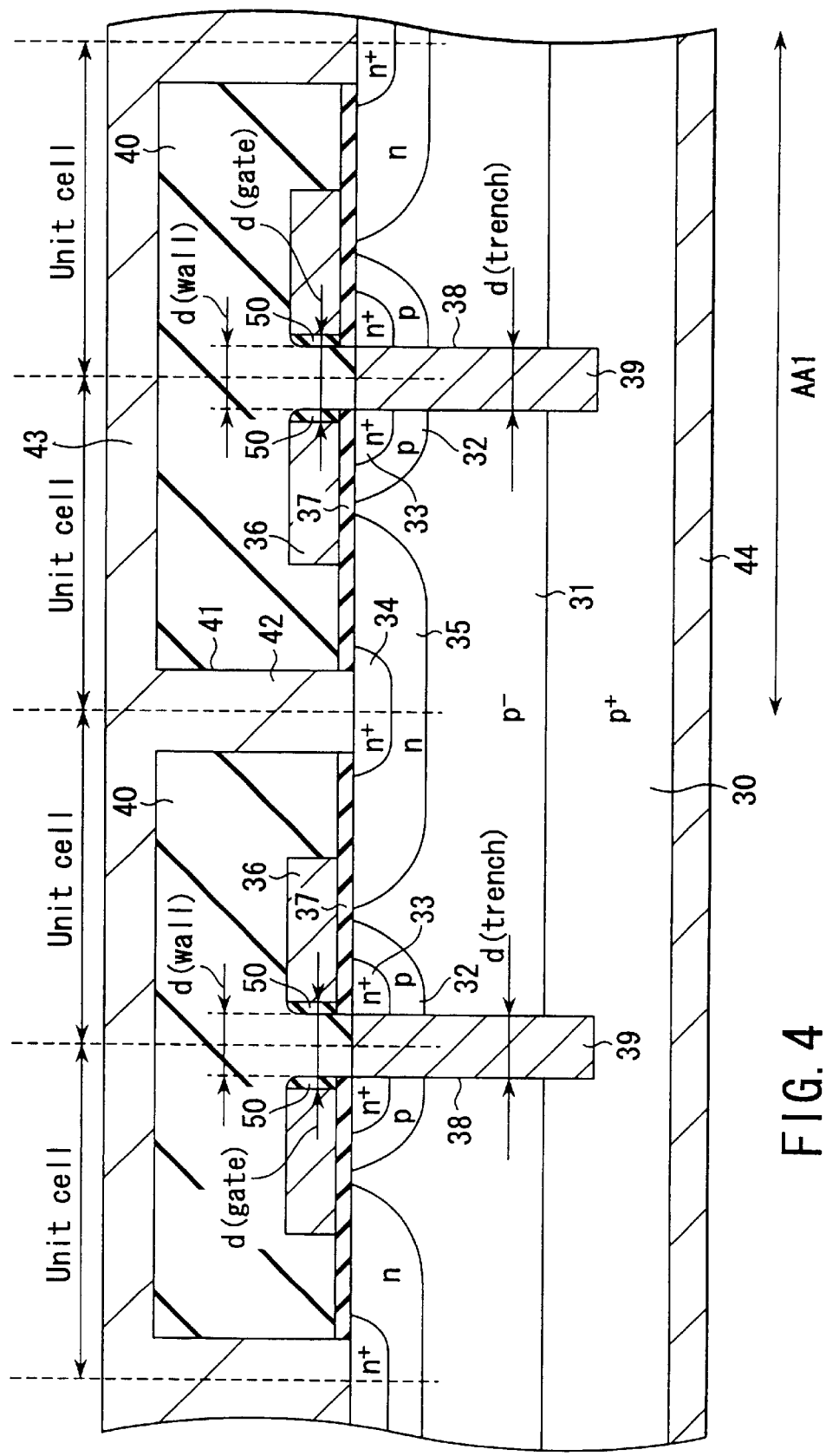
FIG. 4 is a sectional view of a MOS transistor according to the second embodiment of the present invention.

A MOS transistor according to the second embodiment of the present invention will be described next with reference to FIG. 4. FIG. 4 is a sectional view of an offset-gate-type MOS transistor.

As shown in FIG. 4, a p⁻-type epitaxially grown layer 31 is formed on a p⁺-type silicon substrate 30. P-type body regions 32 are selectively formed in the surface region of the p-type epitaxially grown layer 31. An n⁺-type source region 33 is selectively formed in the surface region of each body region 32. An n⁺-type drain region 34 is selectively formed in the surface region of the epitaxial layer 31 between the adjacent body regions 32. An n-type drift region 35 is formed in the surface region of the epitaxially grown layer 31 to surround each n⁺-type drain region 34 while being separated from the body regions. A gate insulating film 37 is formed on each body region 32 and epitaxially grown layer 31 between the source region 33 and the drift region 35. A gate electrode 36 is formed on the gate insulating film 37.

An insulating film 50 is formed at least on the source-region-side sidewall of each gate electrode 36. Trenches 38 extending from the surfaces of the source regions 33 between the adjacent gate electrodes 36 to the silicon substrate 30 are formed in the epitaxially grown layer 31. Each trench 38 is filled with a conductive member 39. Each trench 38 has an opening width d (trench) substantially equal to a distance d (wall) between the insulating films 50 formed on the sidewalls of the adjacent gate electrodes 36. In addition, the extended surface of the inner wall of each trench is flush with the extended surface of one side surface of each insulating film 50. A dielectric interlayer 40 is formed on the silicon substrate 30 to cover the gate electrodes 36 and conductive members 39. Contact holes 41 reaching the drain regions 34 are formed in the dielectric interlayer 40. A drain electrode 42 is buried in each contact hole 41. A drain interconnection layer 43 electrically connected to the drain electrodes 42 is formed on the dielectric interlayer 40. A source electrode 44 is formed on the lower surface of the silicon substrate 30.

Figure 5A:
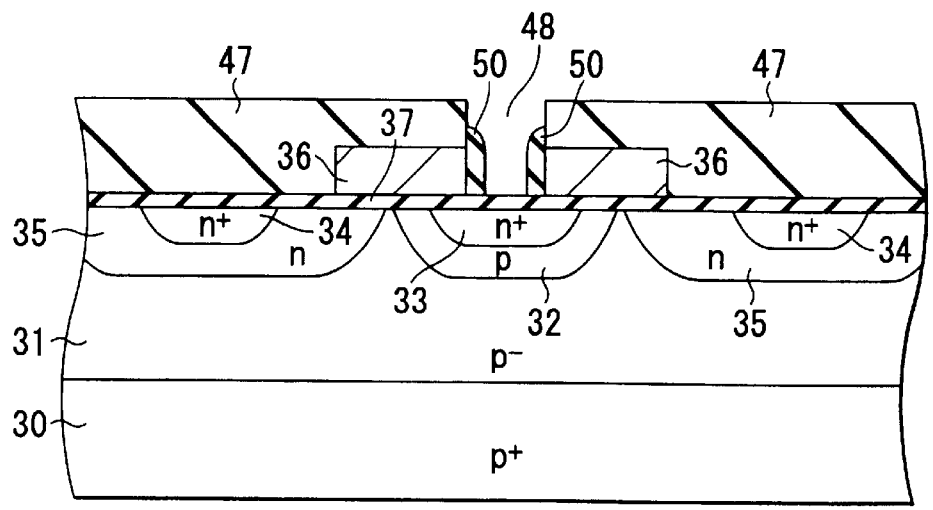
FIGS. 5A to 5C are sectional views sequentially showing the steps in manufacturing the MOS transistor according to the second embodiment of the present invention.
Figure 5B:
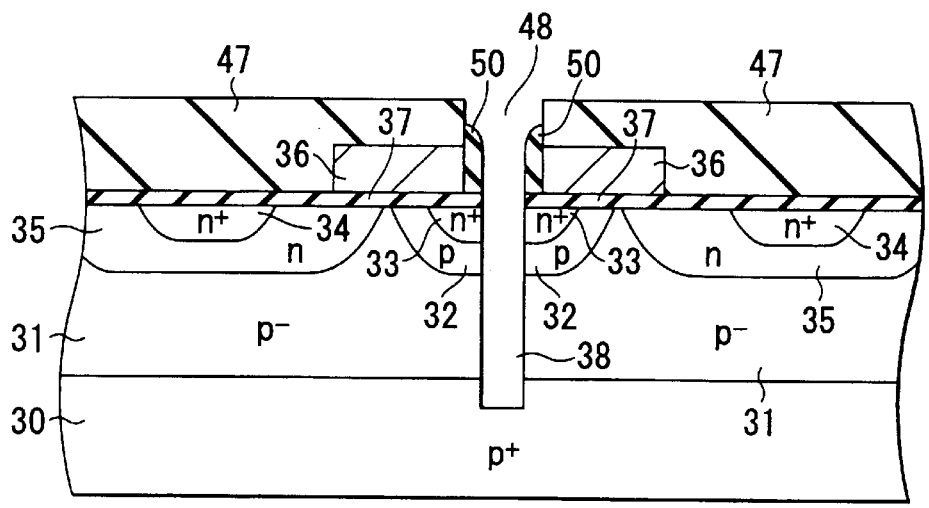
Figure 5C:
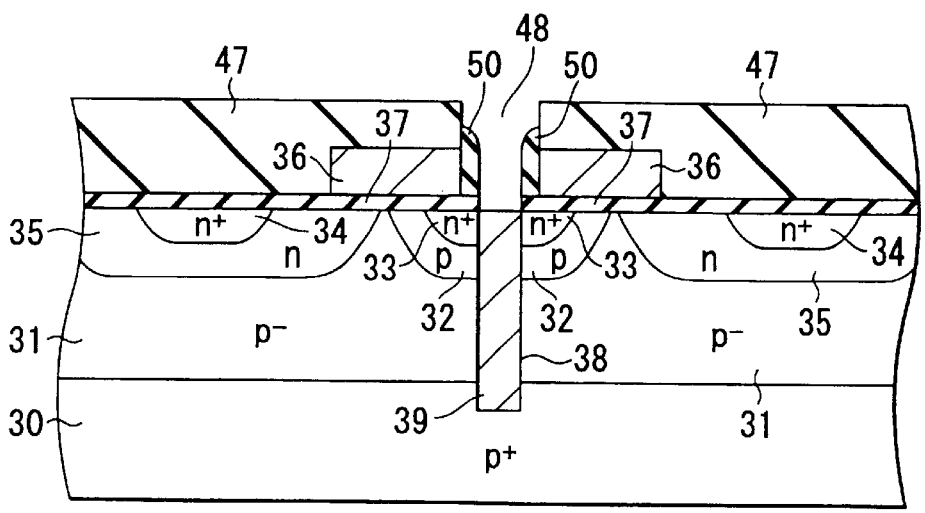

A method of manufacturing the MOS transistor according to this embodiment will be described next with reference to FIGS. 5A to 5C. FIGS. 5A to 5C are sectional views sequentially showing the steps in manufacturing the offset-gate-type MOS transistor. FIGS. 5A to 5C especially show a region AA1 (a region including two unit cells) in FIG. 4.

First, the structure shown in FIG. 3E is formed by in accordance with the procedure described in the first embodiment. The distance d (gate) between adjacent gate electrodes is, e.g., 0.7 μm.

Next, annealing is executed at a temperature of about 1,000° C. to diffuse the impurities in implanted layers 32-1 to 35-1. Consequently, the p-type body region 32, n⁺-type source region 33, n⁺-type drain regions 34, and n-type drift regions 35 are completed. Simultaneously, the sidewall portion of each gate electrode 36, which is exposed into an opening portion 48, is oxidized. With this oxidation, the insulating films 50 (oxide films) are formed on the sidewalls of the gate electrodes 36, thereby obtaining the structure shown in FIG. 5A. The thickness of the insulating film 50 is, e.g., 0.1 μm.

Next, as shown in FIG. 5B, using gate insulating films 47 and 50 as an etching mask, the gate insulating film 37 between the adjacent gate electrodes 36 is removed by RIE using a gas mixture of $CHF_3$ and $SF_6$ or a gas mixture of $CF_4$ and $H_2$. In addition, the epitaxially grown layer 31 is etched by RIE using HBr or $SF_6$ gas to form the trench 38 extending from the surface of the source region 33 to the p⁺-type silicon substrate 30. At this time as well, the insulating films 47 and 50 function as an etching mask. Hence, the opening width of the trench 38 substantially equals the distance between the adjacent insulating films 50 and is, e.g., about 0.5 μm.

As shown in FIG. 5C, the conductive member 39 made of, e.g., tungsten (W) is buried into the trench 38.

After that, the structure shown in FIG. 4 is completed by the step described in the first embodiment with reference to FIG. 3I.

According to the MOS transistor having the above structure, the following effect (5) is obtained in addition to the effects (1) to (4) described in the first embodiment.

(5) The manufacturing process is further facilitated.

In the MOS transistor according to the structure and manufacturing method of this embodiment, the insulating film 50 is formed on the sidewall of each gate electrode 36. For this reason, the gate electrode 36 is surrounded by the insulating film. Hence, even if the upper surface of the conductive member 39 buried in the trench 38 is at a higher level than the bottom surface of each gate electrode 36, i.e., the etch back step for the conductive member 39 has been insufficient, any electrical short circuit between the source region 33 and the gate electrode 36 can be prevented. Since the burying height of the conductive member 39 is not particularly limited, formation of the trench electrode is very easy.

Figure 6A:
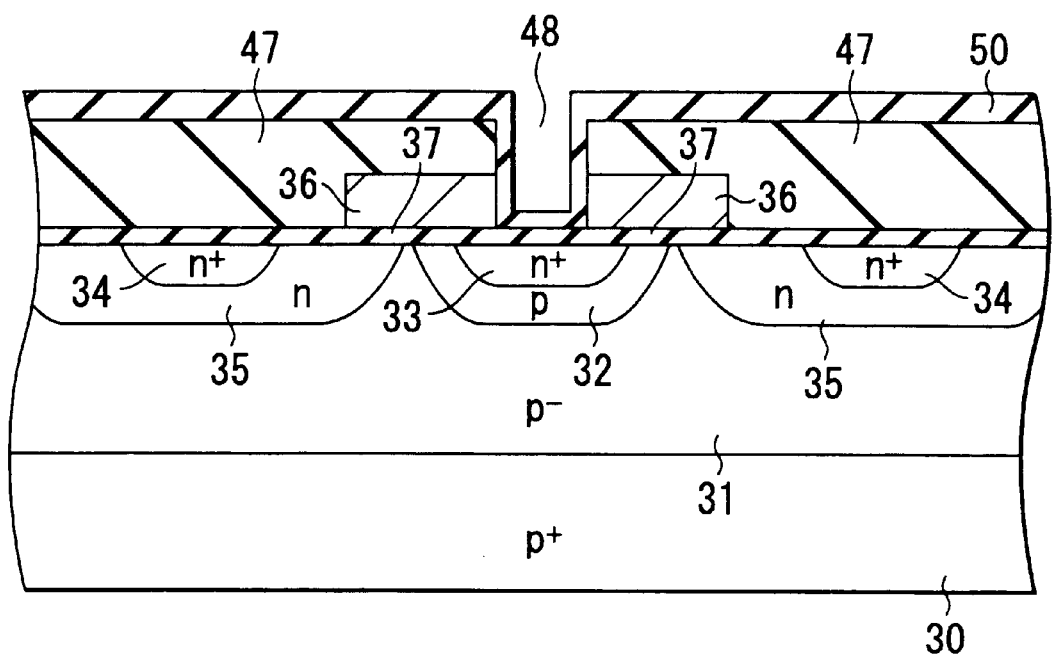
FIGS. 6A and 6B are sectional views sequentially showing the steps in manufacturing a MOS transistor according to the first modification to the second embodiment of the present invention.
Figure 6B:
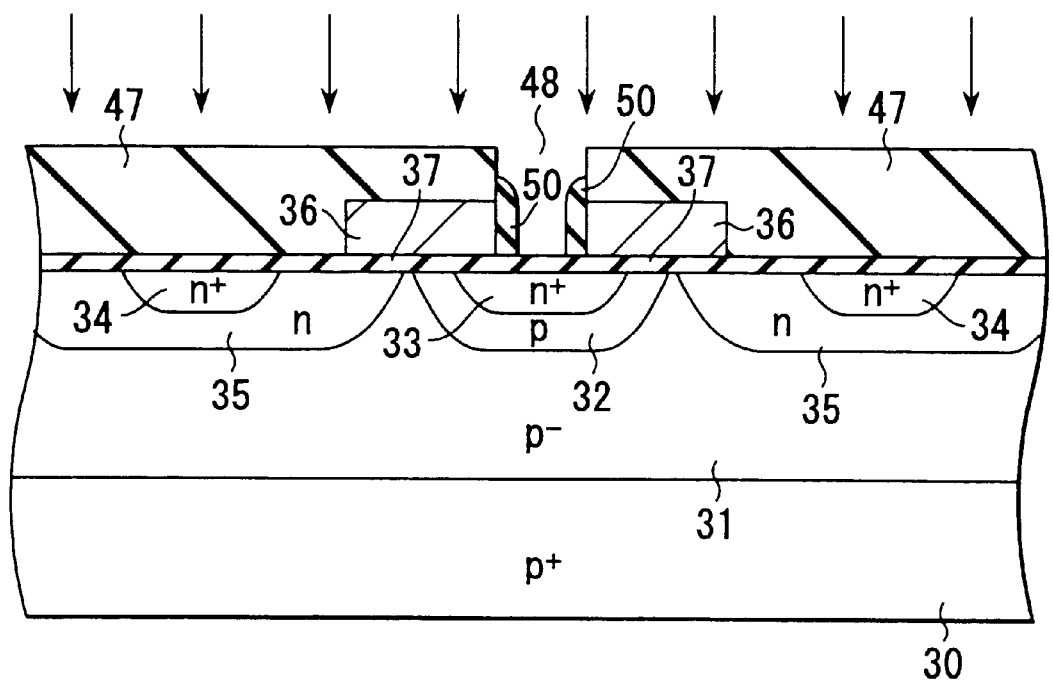

The insulating film 50 on the gate electrode sidewall need not always be formed by oxidation. Another method of forming the insulating film 50 will be described with reference to FIGS. 6A and 6B as the first modification to this embodiment. FIGS. 6A and 6B are sectional views of the steps in manufacturing a MOS transistor.

First, the structure shown in FIG. 3F is formed by the manufacturing steps of the first embodiment. After that, as shown in FIG. 6A, the insulating film 50 having a thickness of, e.g., 0.1 μm is formed in the opening portion 48 and on the insulating film 47 by CVD.

The insulating film 50 on the insulating film 47 and gate insulating film 37 is etched back to leave the insulating film 50 only on the sidewall of each gate electrode 36, thereby obtaining the structure shown in FIG. 6B.

Even with this method, the insulating film 50 can be formed on the gate electrode sidewall. In this case, in forming the insulating film 50 in FIG. 6A, the opening portion 48 must be prevented from being completely filled with the insulating film 50.

Figure 7:
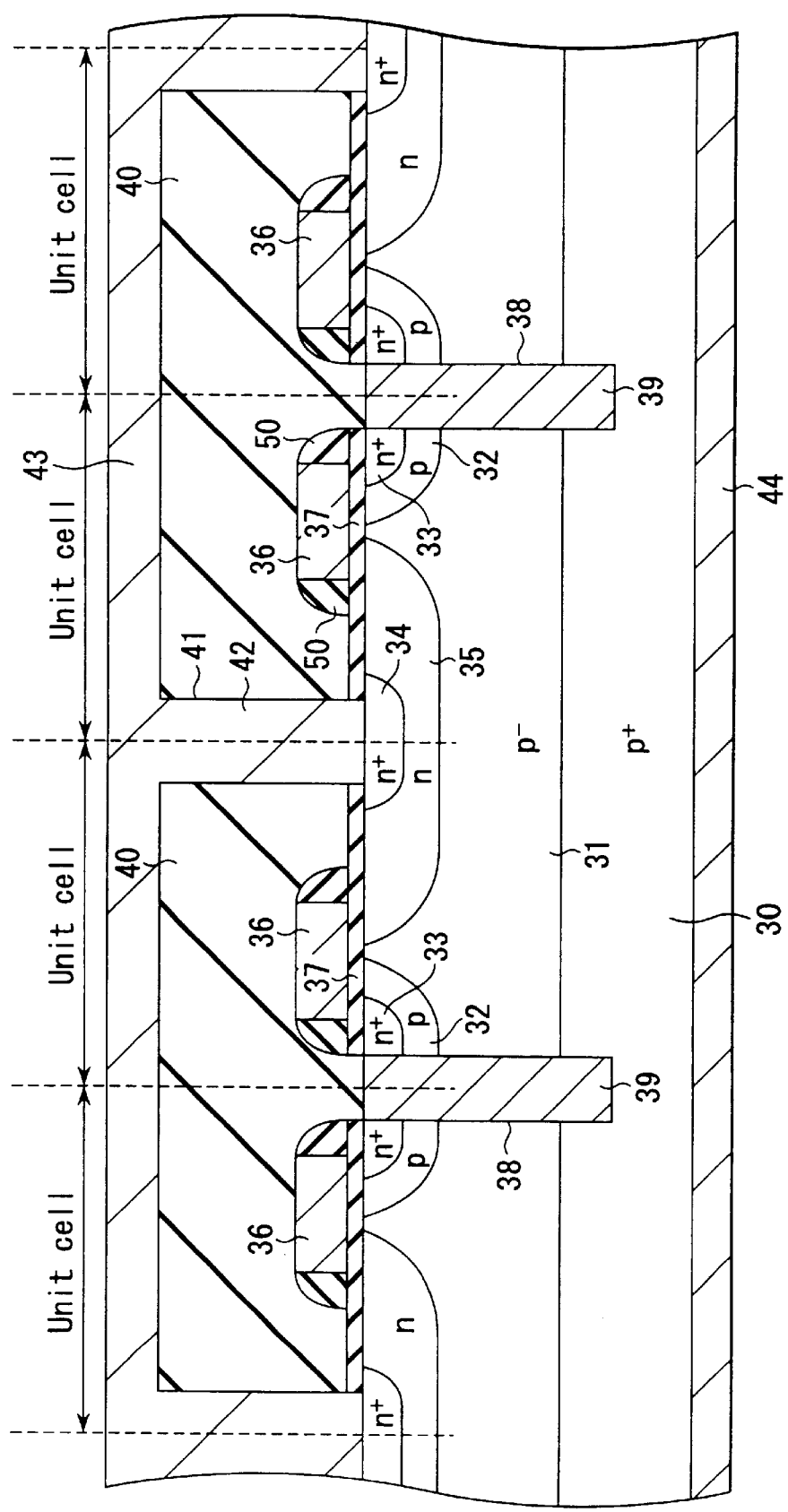
FIG. 7 is a sectional view of a MOS transistor according to the second modification to the second embodiment of the present invention.

An example in which the insulating film 50 is formed by still another method will be described with reference to FIG. 7 as the second modification to this embodiment. FIG. 7 is a sectional view of a MOS transistor.

As shown in FIG. 7, the structure according to this modification uses, as the insulating film 50, a sidewall that is widely used in a CMOS (Complementary MOS) structure or the like. In this case as well, the same effects as described above can be obtained.

Figure 8:
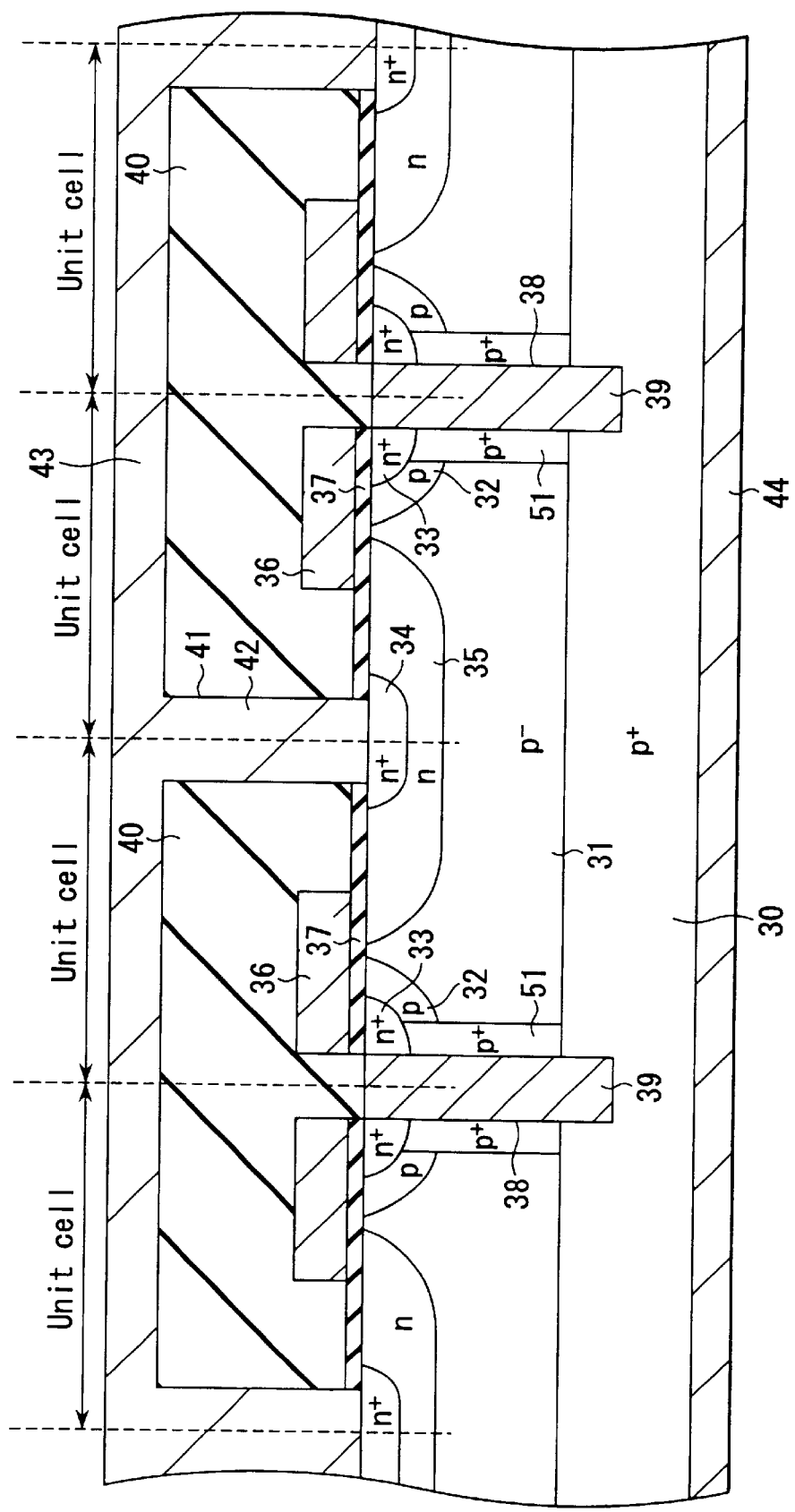
FIG. 8 is a sectional view of a MOS transistor according to the third embodiment of the present invention.

A MOS transistor according to the third embodiment of the present invention will be described next with reference to FIG. 8. FIG. 8 is a sectional view of an offset-gate-type MOS transistor. For the simplicity, a description of the same parts as in the structure shown in FIG. 2 described in the first embodiment will be omitted.

As shown in FIG. 8, the MOS transistor according to this embodiment further comprises p⁺-type semiconductor layers 51 in the structure shown in FIG. 2. Each p⁺-type semiconductor layer 51 is formed in an epitaxially grown layer 31 along the sidewall of a trench 38 while being in contact with a source region 33 and silicon substrate 30. A body region 32 is electrically connected to a conductive member 39 through the semiconductor layer 51 with a low resistance.

Figure 9:
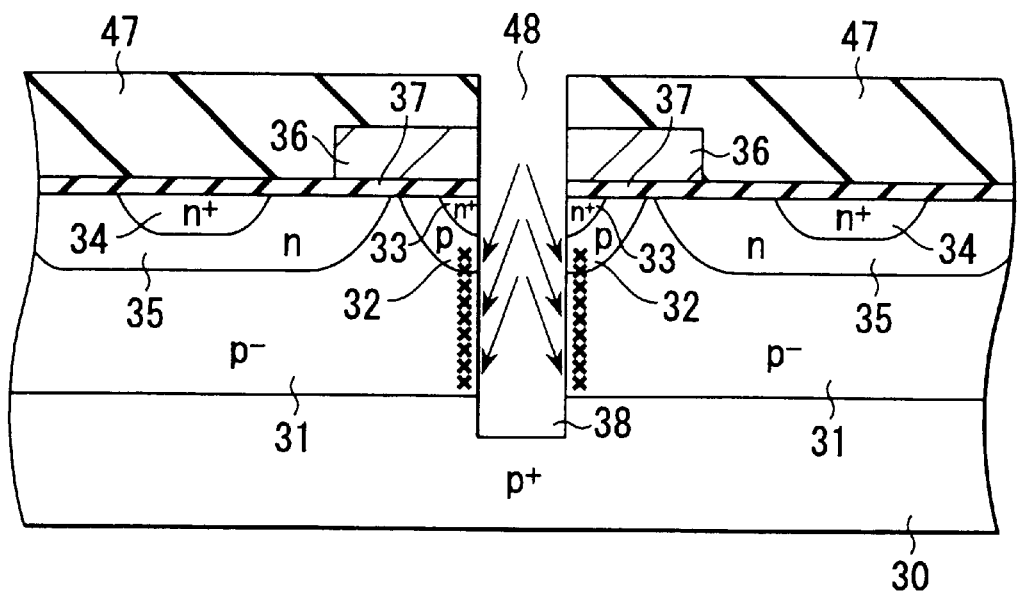
FIG. 9 is a sectional view showing some of the steps in manufacturing the MOS transistor according to the third embodiment of the present invention.

A method of manufacturing the MOS transistor having the above structure will be described next with reference to FIG. 9. FIG. 9 is a sectional view showing some of the steps in manufacturing the MOS transistor.

The structure shown in FIG. 3G described in the first embodiment is formed. After that, as shown in FIG. 9, a p-type impurity such as boron is ion-implanted into the epitaxially grown layer 31 and body region 32 on the sidewall of the trench 38 at a high concentration by oblique ion implantation. When the impurity is activated by annealing, the p⁺-type semiconductor layer 51 can be formed.

After that, the structure shown in FIG. 8 is completed by the manufacturing steps described in the first embodiment with reference to FIGS. 3H and 3I.

Even according to the MOS transistor having the above structure, the effects (1) to (4) described in the first embodiment are obtained. The p⁺-type semiconductor layer 51 is formed in a region immediately under the source region 33. The body region 32 is electrically connected to the conductive member 39 through the p⁺-type semiconductor layer 51. In other words, the p⁺-type semiconductor layer 51 serves as part of the body region. The resistance of the body region becomes low, and the contact resistance between the body region and the conductive member is decreased. As a result, the ruggedness to avalanche current of the MOS transistor can be further improved.

Figure 10:
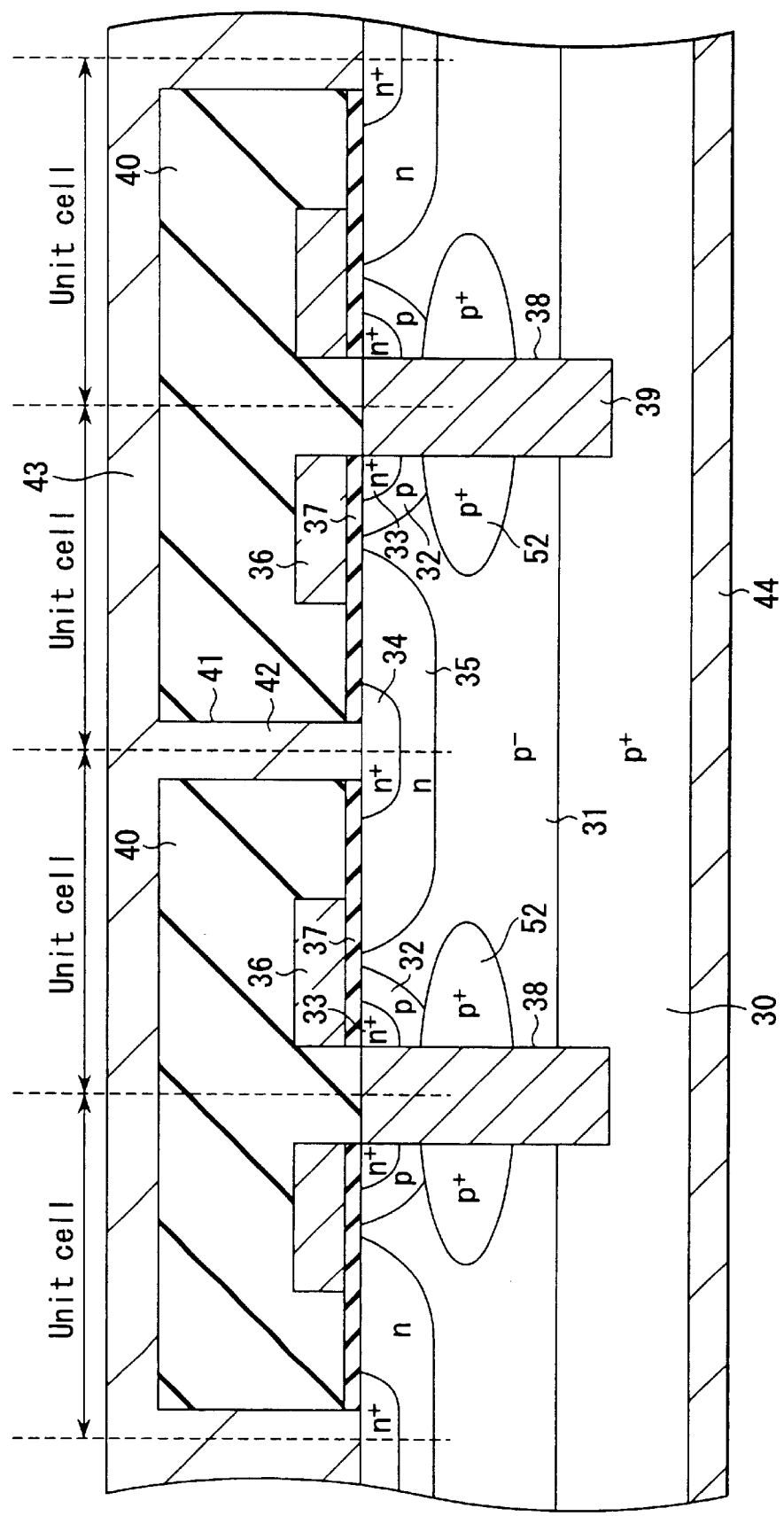
FIG. 10 is a sectional view of a MOS transistor according to the fourth embodiment of the present invention.

A MOS transistor according to the fourth embodiment of the present invention will be described next with reference to FIG. 10. FIG. 10 is a sectional view of an offset-gate-type MOS transistor. For the simplicity, a description of the same parts as in the structure shown in FIG. 2 described in the first embodiment will be omitted.

As shown in FIG. 10, the MOS transistor according to this embodiment further comprises p⁺-type semiconductor layers 52 in the structure shown in FIG. 2. Each p⁺-type semiconductor layer 52 is formed in an epitaxially grown layer 31 along the sidewall of a trench 38. The upper surface of the semiconductor layer 52 is in contact with the bottom portion of a body region 32. The body region 32 is electrically connected to a conductive member 39 through the semiconductor layer 52 with a low resistance.

A method of manufacturing the MOS transistor having the above structure will be described next with reference to FIGS. 11A to 11D. FIGS. 11A to 11D are sectional views sequentially showing the steps in manufacturing the MOS transistor.

First, the structure shown in FIG. 3D is obtained by the steps described in the first embodiment.

Figure 11A:
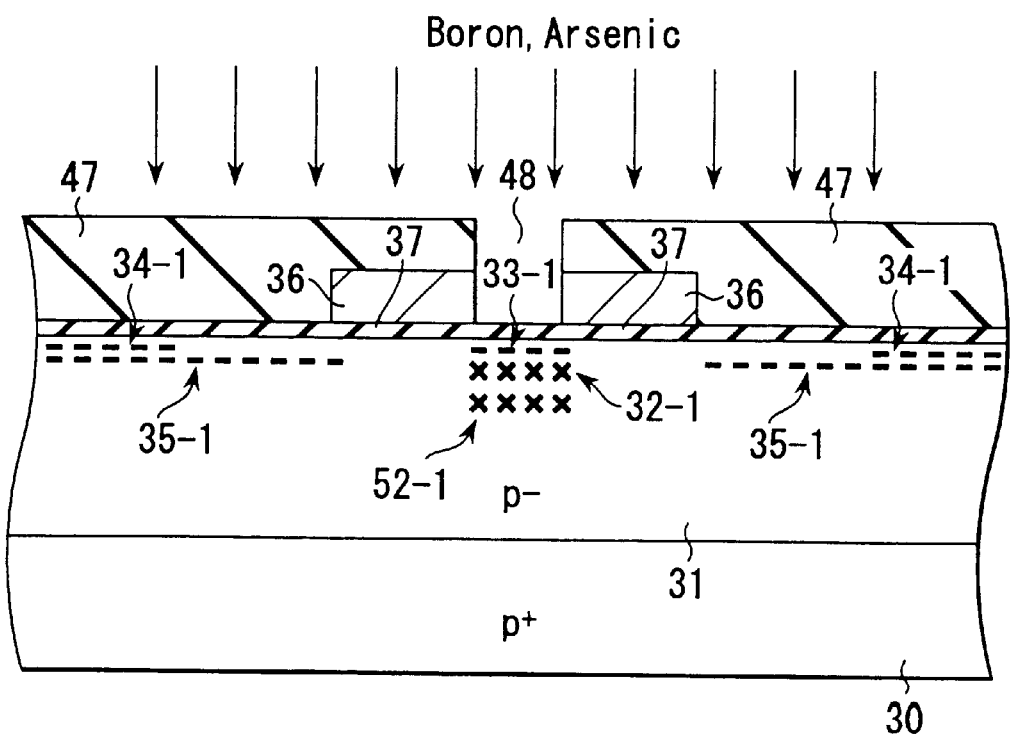
FIGS. 11A to 11D are sectional views sequentially showing the steps in manufacturing the MOS transistor according to the fourth embodiment of the present invention.

Next, as shown in FIG. 11A, a p-type impurity such as boron to form the p-type body region 32, an n-type impurity such as arsenic to form an $n^+$-type source region 33, and a p-type impurity such as boron to form the $p^+$-type semiconductor layer 52 are ion-implanted into the epitaxially grown layer 31 using an insulating film 47 as a mask, thereby forming a boron-implanted layer 32-1, arsenic-implanted layer 33-1, and boron-implanted layer 52-1. The boron-implanted layer 52-1 is formed to be deeper than the boron-implanted layer 32-1 and arsenic-implanted layer 33-1 by adjusting the acceleration voltage in ion implantation. For example, the boron-implanted layer 32-1 and arsenic-implanted layer 33-1 are formed by ion implantation at acceleration voltages of about 60 kV and 50 kV, respectively. The boron-implanted layer 52-1 is formed by ion implantation at an acceleration voltage of about 500 kV.

Figure 11B:
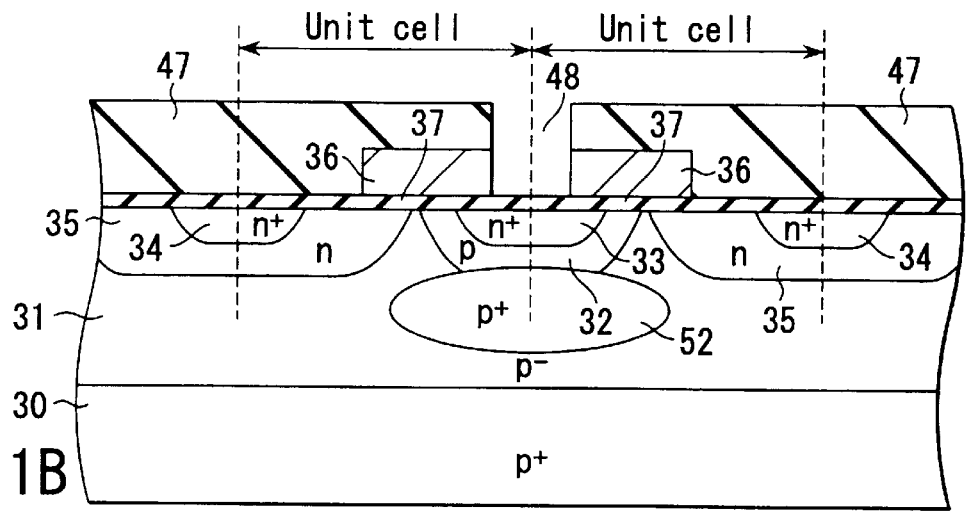

As shown in FIG. 11B, annealing is executed at a temperature of about 1,000° C. to diffuse the impurities in the implanted layers 32-1 to 35-1 and 52-1, as in the first embodiment. Consequently, the p-type body region 32, $n^+$-type source region 33, $n^+$-type drain regions 34, n-type drift regions 35, and $p^+$-type semiconductor layer 52 are completed.

Figure 11C:
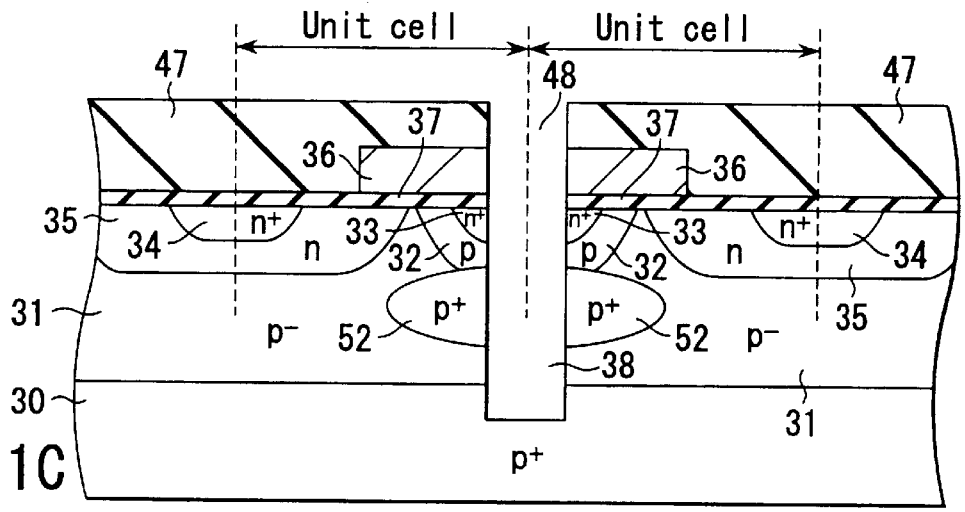

Next, as shown in FIG. 11C, using gate electrodes 36 and insulating film 47 as an etching mask, a gate insulating film 37 between the adjacent gate electrodes 36 is removed by RIE using a gas mixture of $CHF_3$ and $SF_6$ or a gas mixture of $CF_4$ and $H_2$. When both the gate insulating film 37 and insulating film 47 are formed from silicon dioxide films, both films are etched. Hence, the insulating film 47 must have an extra thickness in advance. In addition, the epitaxially grown layer 31 is etched by RIE using HBr or $SF_6$ gas to form the trench 38 extending from the surface of the source region 33 to a $p^+$-type silicon substrate 30 through the body region 32 and $p^+$-type semiconductor layer 52. At this time as well, the gate electrodes 36 and insulating film 47 function as an etching mask. Hence, the opening width of the trench 38 substantially equals the distance between the adjacent gate electrodes 36.

Figure 11D:
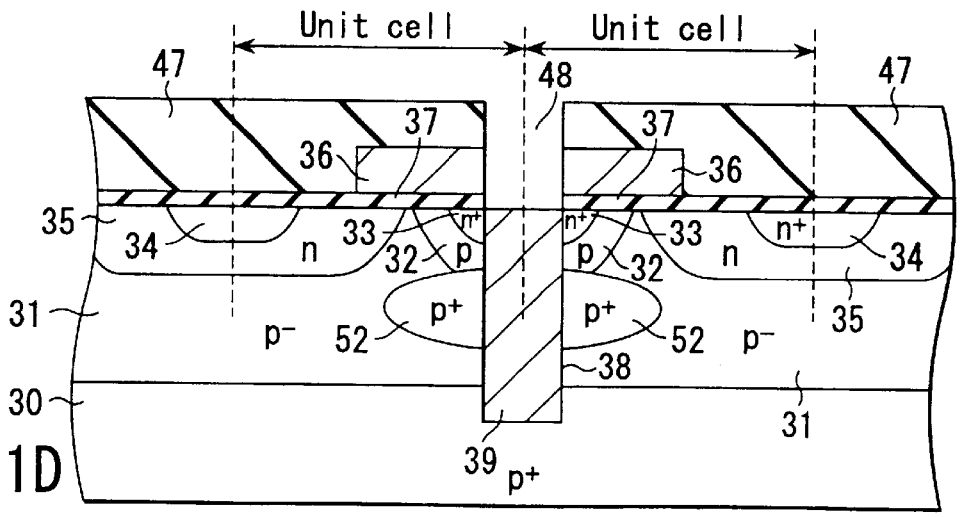

As shown in FIG. 11D, the conductive member 39 made of, e.g., tungsten is formed on the insulating film 47 and in the trench 38. The conductive member 39 on the insulating film 47 and in an opening portion 48 is etched back by CDE, thereby obtaining a trench electrode in which the conductive member 39 remains only in the trench 38, as shown in FIG. 11D.

After that, an insulating film 49 such as a silicon dioxide film is formed in the opening portion 48 between the adjacent gate electrodes 36 and on the insulating film 47. The insulating films 47 and 49 form a dielectric interlayer 40. A contact hole 41 reaching the drain region 34 is formed in the dielectric interlayer 40. A drain electrode 42 is formed in the contact hole 41. A source electrode 44 is formed on the lower surface of the silicon substrate 30. A drain interconnection layer 43 is formed on the dielectric interlayer 40. Thus, the MOS transistor shown in FIG. 10 is completed.

According to the MOS transistor having the above structure, the effects (1) to (4) described in the first embodiment can be obtained. In addition, since the $p^+$-type semiconductor layer 52 is formed, the effect described in the third embodiment can be obtained. That is, since the resistance to holes immediately under the $n^+$-type source region 33 can be reduced, and the contact resistance between the conductive member 39 and the body region 32 can be decreased, the ruggedness to avalanche current of the MOS transistor can be further improved.

Figure 12A:
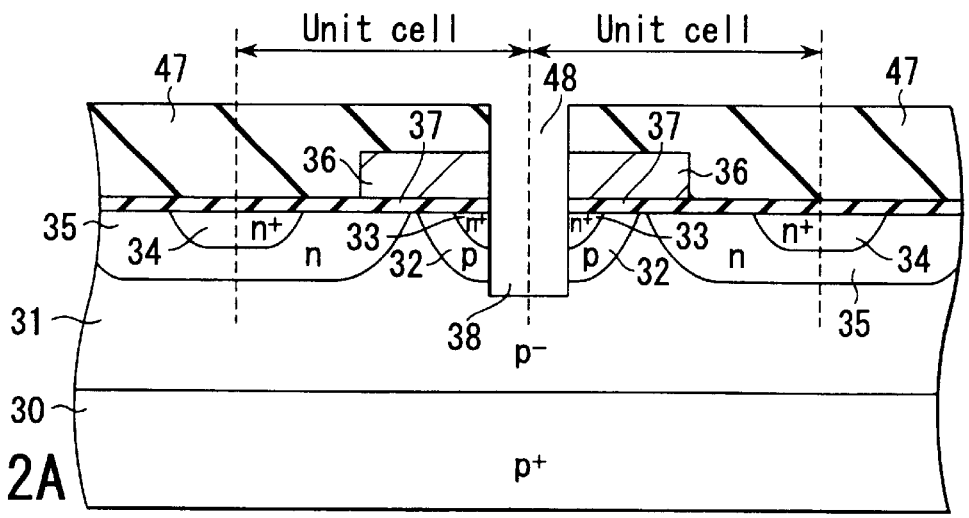
FIGS. 12A to 12C are sectional views sequentially showing the steps in manufacturing a MOS transistor according to a modification to the fourth embodiment of the present invention.
Figure 12B:
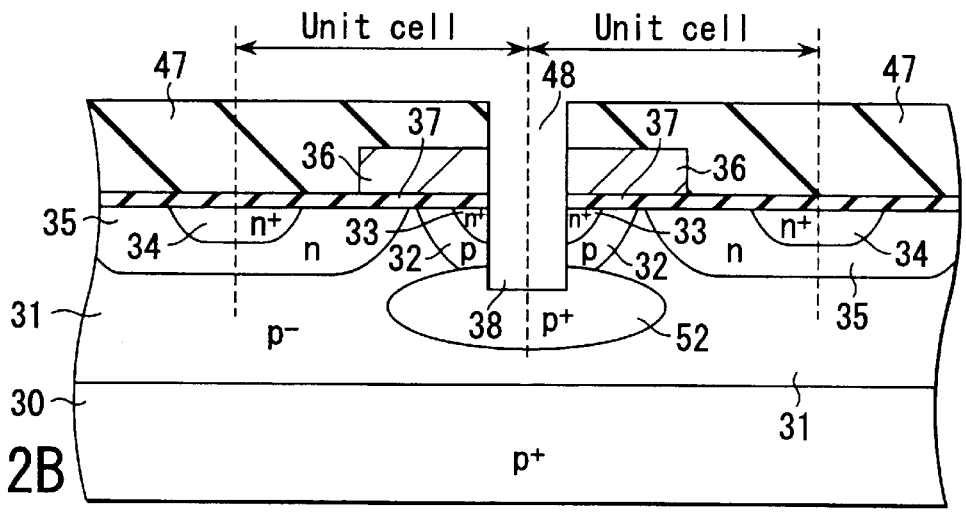
Figure 12C:
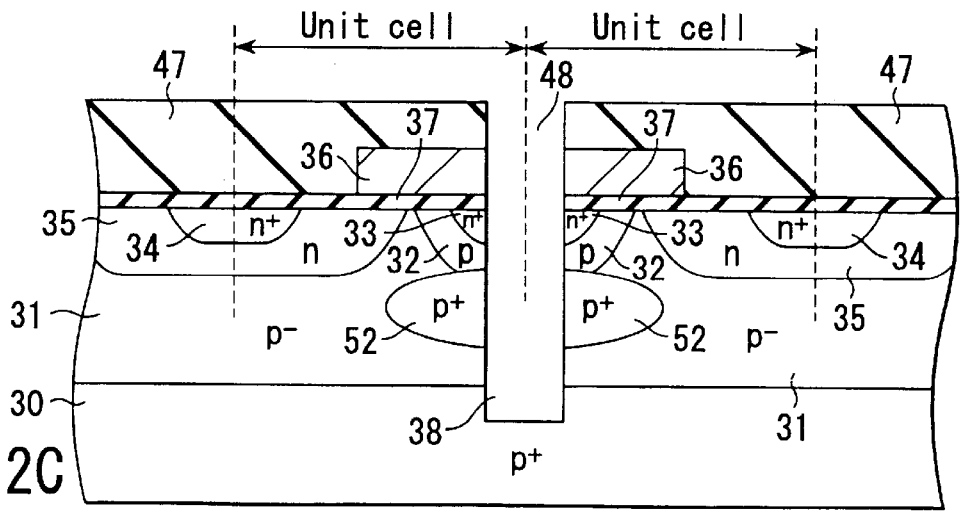

The method of forming the $p^+$-type semiconductor layer 52 is not limited to the above method. Another method of forming the $p^+$-type semiconductor layer 52 will be described with reference to FIGS. 12A to 12C as a modification to this embodiment. FIGS. 12A to 12C are sectional views sequentially showing the steps in manufacturing a MOS transistor.

First, the structure shown in FIG. 3F is formed by the steps described in the first embodiment. Next, as shown in FIG. 12A, using the gate electrodes 36 and insulating film 47 as an etching mask, the gate insulating film 37 between the adjacent gate electrodes 36 is removed by RIE using a gas mixture of $CHF_3$ and $SF_6$ or a gas mixture of $CF_4$ and $H_2$. In addition, the epitaxially grown layer 31 is etched by RIE using HBr or $SF_6$ gas to form the trench 38 extending from the surface of the source region 33 to the $p^-$-type epitaxially grown layer 31 through the source region 33 and body region 32. At this time as well, the gate electrodes 36 and insulating film 47 function as an etching mask.

As shown in FIG. 12B, a p-type impurity such as boron to form the $p^+$-type semiconductor layer 52 is ion-implanted from the bottom surface of the trench 38 into the epitaxially grown layer 31 using the insulating film 47 as a mask. Annealing is executed at a temperature of about 1,000° C. to diffuse the impurity, thereby forming the $p^+$-type semiconductor layer 52. The $p^+$-type semiconductor layer 52 must be formed in contact with the bottom portion of the body region 32.

As shown in FIG. 12C, the epitaxially grown layer 31 exposed to the bottom surface of the trench 38 is etched by RIE using HBr or $SF_6$ gas until etching reaches the silicon substrate 30 through the body region 32 and $p^+$-type semiconductor layer 52. At this time as well, the gate electrodes 36 and insulating film 47 function as an etching mask.

After that, the conductive member 39 made of, e.g., tungsten is formed on the insulating film 47 and in the trench 38. The conductive member 39 on the insulating film 47 and in the opening portion 48 is etched back by CDE, thereby obtaining a trench electrode in which the conductive member 39 remains only in the trench 38. Additionally, the insulating film 49 such as a silicon dioxide film is formed in the opening portion 48 between the adjacent gate electrodes 36 and on the insulating film 47. The insulating films 47 and 49 form the dielectric interlayer 40. The contact hole 41 reaching the drain region 34 is formed in the dielectric interlayer 40. The drain electrode 42 is formed in the contact hole 41. The source electrode 44 is formed on the lower surface of the silicon substrate 30. The drain interconnection layer 43 is formed on the dielectric interlayer 40. Thus, the MOS transistor shown in FIG. 10 is completed.

Figure 13A:
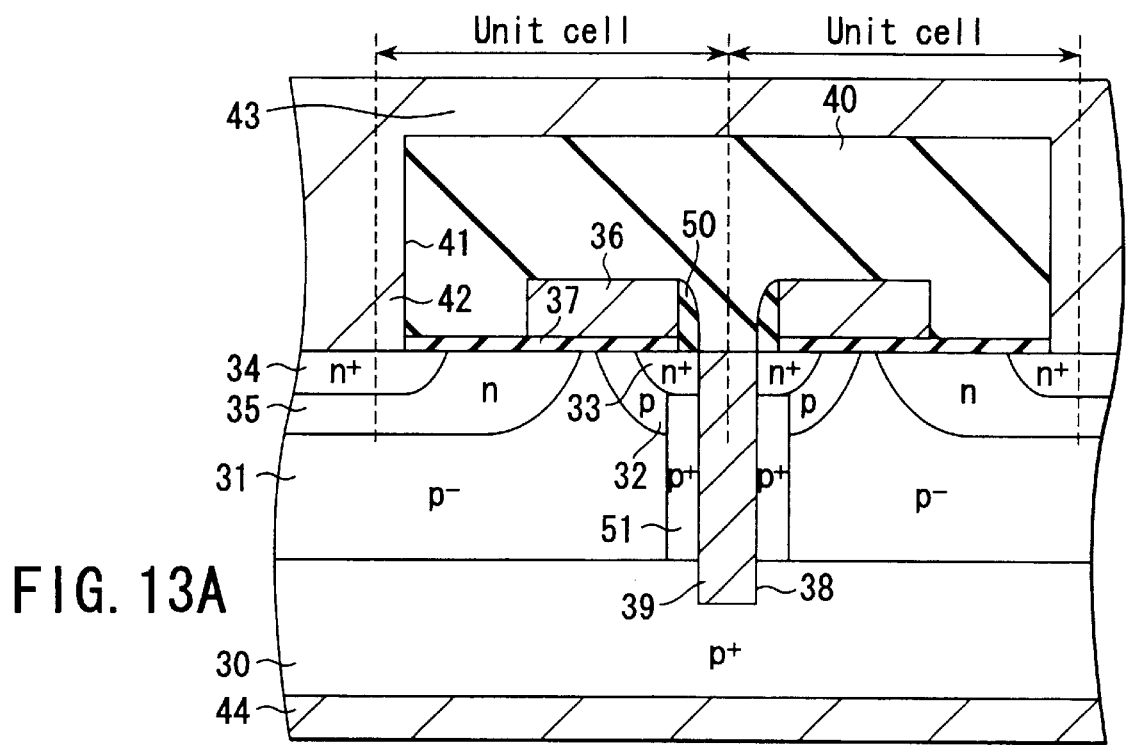
FIGS. 13A and 13B are sectional views of MOS transistors according to the first and second modifications to the first to fourth embodiments of the present invention.

A MOS transistor according to the first modification to the first to fourth embodiments will be described next with reference to FIG. 13A. FIG. 13A is a sectional view of an offset-gate-type MOS transistor.

In this modification, the second and third embodiments are combined. As shown in FIG. 13A, in the structure wherein the insulating film 50 is formed on the sidewall portion of each gate electrode 36, the $p^+$-type semiconductor layer 51 may be formed between the source region 33 and the silicon substrate 30. According to this modification, all the effects of the second and third embodiments can be obtained.

Figure 13B:
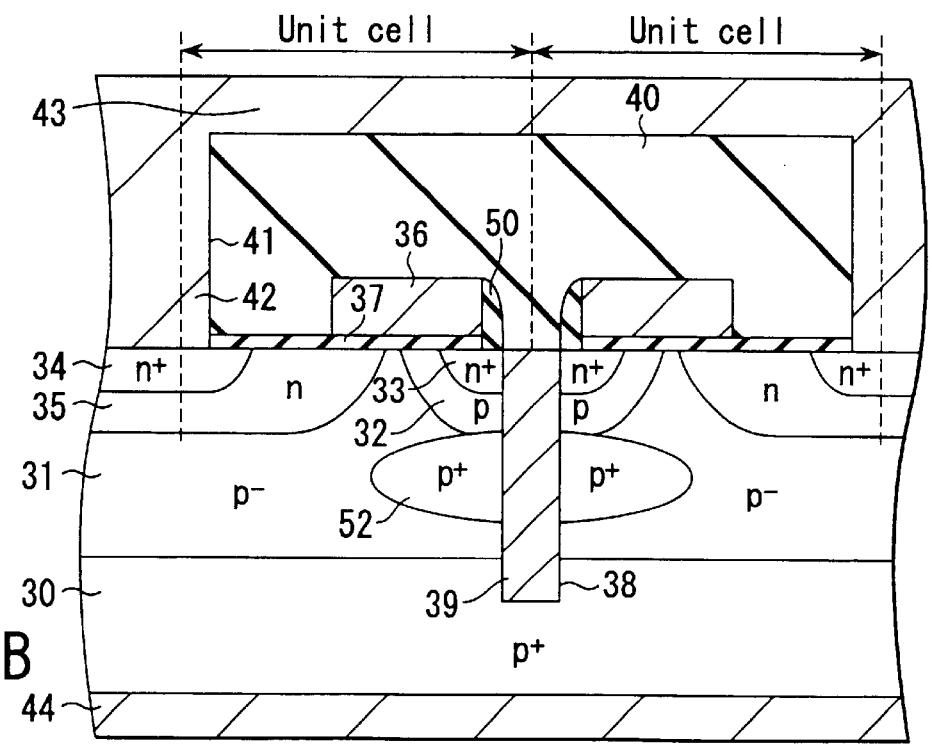

FIG. 13B is a sectional view of an offset-gate-type MOS transistor according to the second modification to the first to fourth embodiments.

In this modification, the second and fourth embodiments are combined. As shown in FIG. 13B, in the structure wherein the insulating film 50 is formed on the sidewall portion of each gate electrode 36, the p⁺-type semiconductor layer 52 may be formed in the region immediately under the body region 32. According to this modification, all the effects of the second and fourth embodiments can be obtained.

Figure 14A:
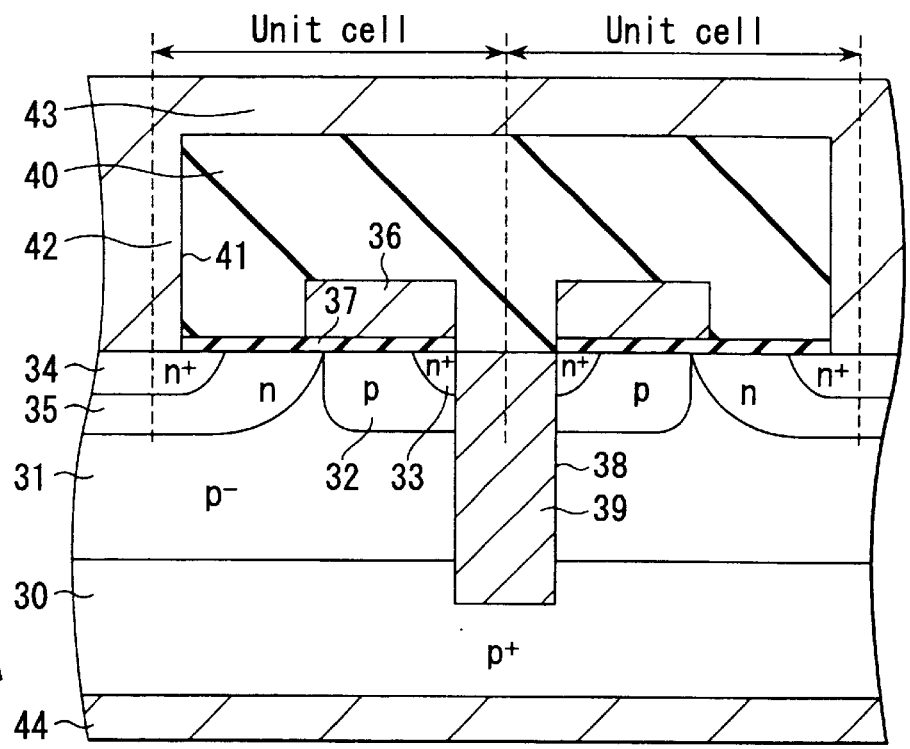
FIGS. 14A to 14C are sectional views of MOS transistors according to the third to fifth modifications to the first to fourth embodiments of the present invention.
Figure 14B:
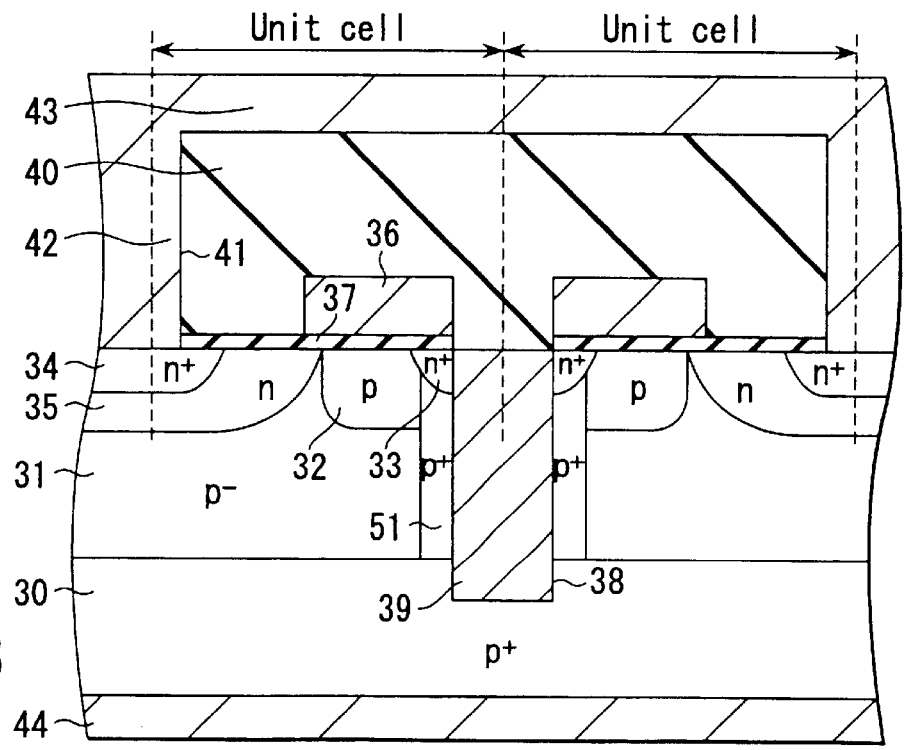
Figure 14C:
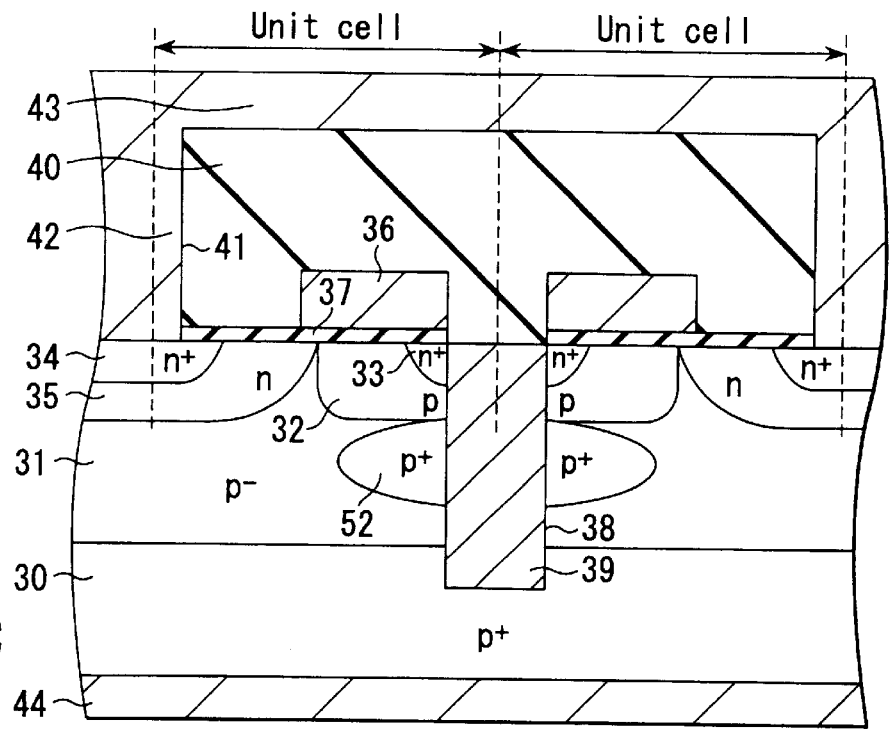

FIGS. 14A to 14C are sectional views of offset-gate-type MOS transistors according to the third to fifth modifications to the first to fourth embodiments.

The MOS transistors according to these modifications are offset-gate-type MOS transistors as in the first to fourth embodiments. However, the p-type body region 32 is formed in contact with the n-type drift region 35. This structure can be implemented by forming the body region 32 before the gate electrodes 36. In FIGS. 14A to 14C, the first, third, and fourth embodiments are applied to a MOS transistor having the above structure.

According to these modifications, in addition to the effects described in the above embodiments, a punch through phenomenon hardly occurs although the channel length increases.

Figure 15A:
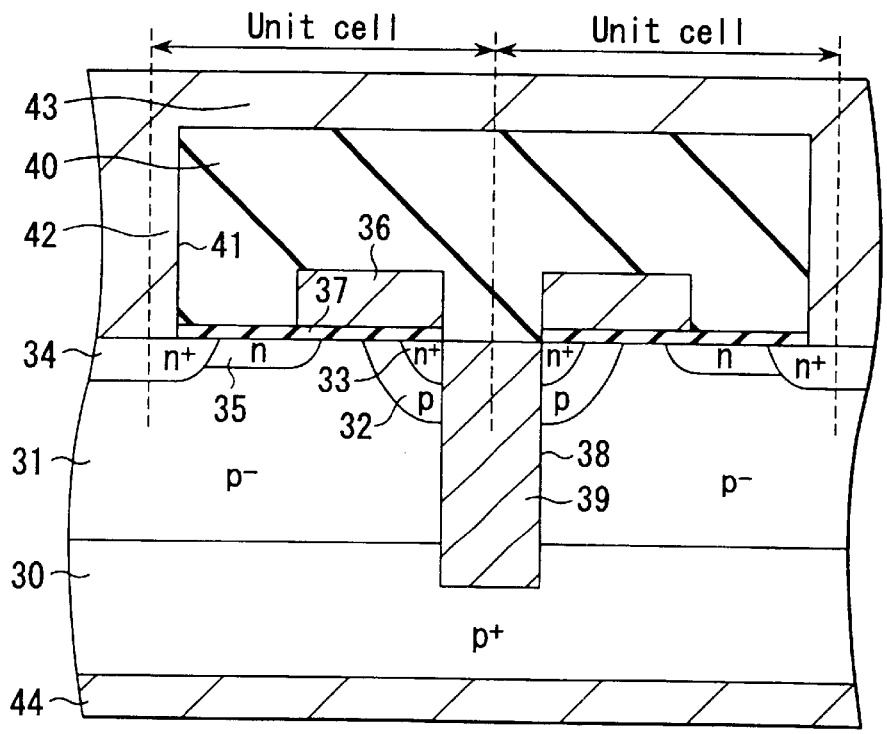
FIGS. 15A to 15C are sectional views of MOS transistors according to the sixth to eighth modifications to the first to fourth embodiments of the present invention.
Figure 15B:
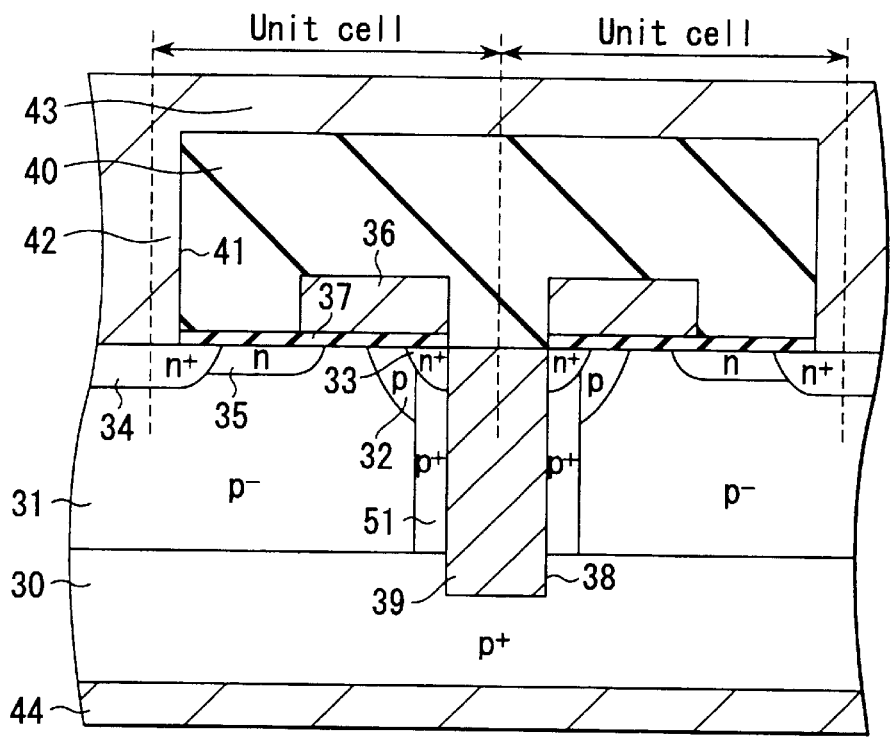
Figure 15C:
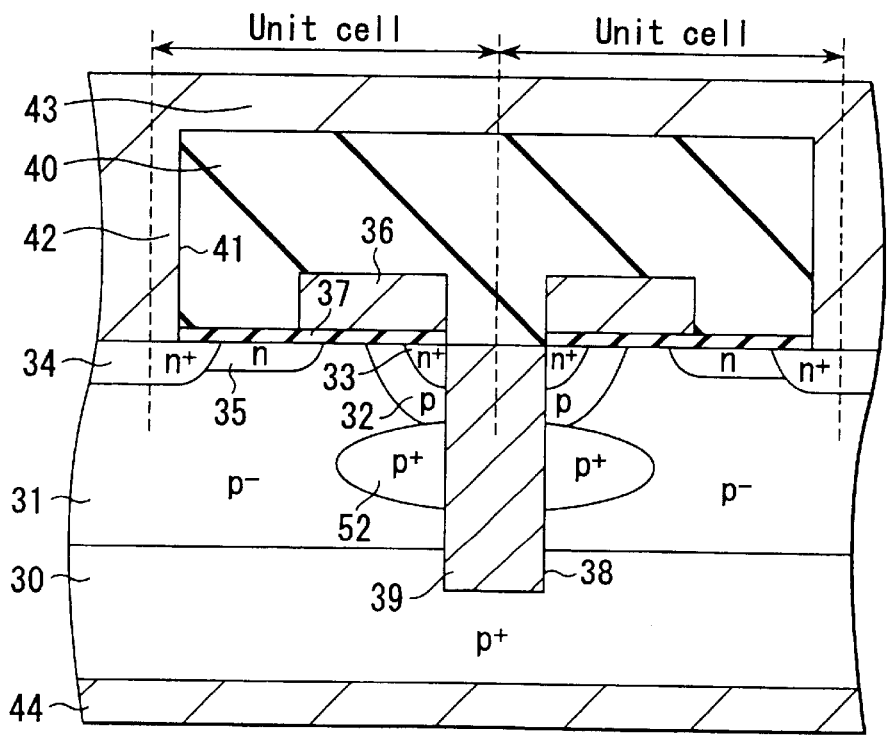

FIGS. 15A to 15C are sectional views of offset-gate-type MOS transistors according to the sixth to eighth modifications to the first to fourth embodiments.

The MOS transistors according to these modifications are offset-gate-type MOS transistors as in the first to fourth embodiments. However, the drift region 35 is formed to be shallower than the n⁺-type drain region 34. In FIGS. 15A to 15C, the first, third, and fourth embodiments are applied to a MOS transistor having the above structure.

The second embodiment may be applied to the above modifications. That is, in the structures shown in FIGS. 14A to 14C and 15A to 15C, the insulating film 50 may be formed on the sidewall portion of each gate electrode 36.

Figure 16A:
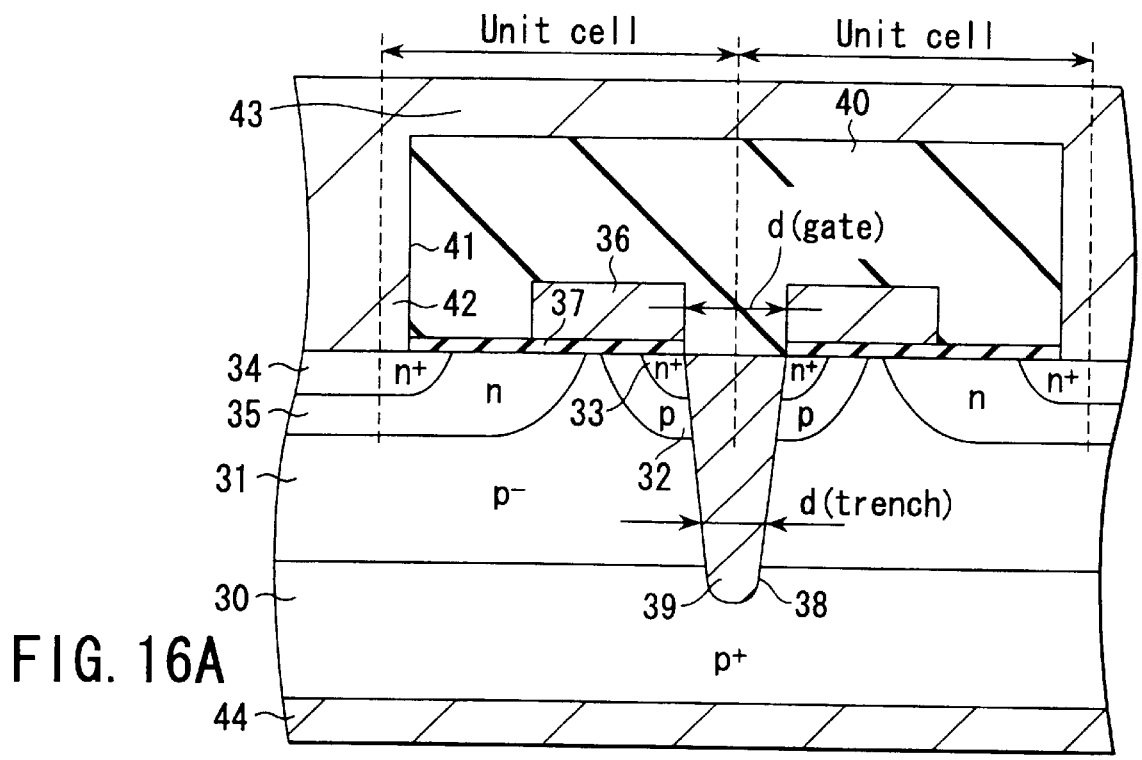
FIGS. 16A and 16B are sectional views of MOS transistors according to the ninth and 10th modifications to the first to fourth embodiments of the present invention.

FIG. 16A is a sectional view of an offset-gate-type MOS transistor according to the ninth modification to the first to fourth embodiments.

In this modification, the opening width d (trench) of the trench 38 becomes smaller as the depth increases. When a trench is formed by RIE, normally, the opening width d (trench) becomes smaller as the depth increases. In the first to fourth embodiments, the trench opening width may change in accordance with the depth. The trench opening width rather preferably decreases as the depth increases because the filling properties in the trench improve.

Figure 16B:
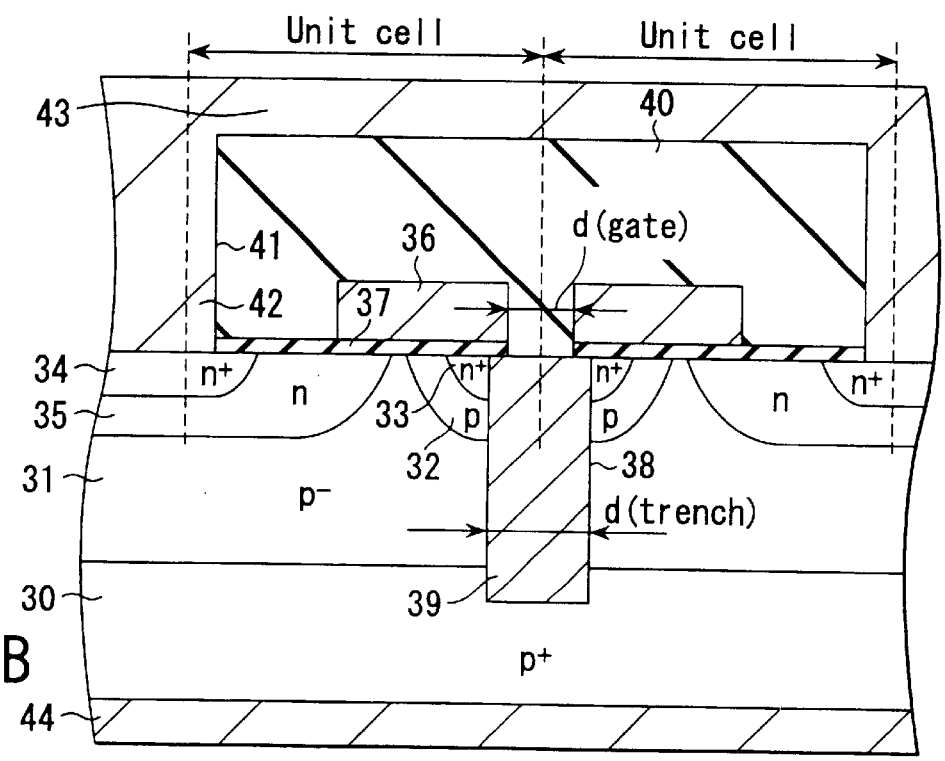

FIG. 16B is a sectional view of an offset-gate-type MOS transistor according to the 10th modification to the first to fourth embodiments. In this modification, the opening width d (trench) of the trench 38 is larger at its opening end portion than the width d (gate) between the adjacent gate electrodes 36.

As shown in FIG. 16B, even if the trench electrode partially enters the lower portions of the gate electrodes 36, the same effects as in the first to fourth embodiments can be obtained.

The trench electrode serves as a reach through layer which electrically connects the source region 33 and silicon substrate 30 in the conventional structure. Hence, the effects are obtained by forming the trench electrode narrower than the reach through layer that is formed by impurity diffusion.

When the distance between the gate electrodes is decreased, the transistor size can be reduced. For this reason, if the opening width can be decreased at the opening end of the trench, a sufficient effect can be obtained. A more preferable form is obtained when d (trench)=d (gate), as described in the first to fourth embodiments. Hence, d (trench) may be slightly different from d (gate), e.g., d (trench)<d (gate). It suffices that d (trench) almost equals d (gate).

Hence, the description in this specification, "the trench 38 has the opening width d (trench) substantially equal to the distance d (gate) between the adjacent gate electrodes 36" or "each gate electrode 36 is laid out to be adjacent to the trench 38 such that the extended surface of one side surface becomes flush with the extended surface of the inner wall of the trench 38" is sufficiently satisfied when "at least the opening end of the trench 38 substantially equals the distance between the gate electrodes" or "the trench 38 is formed using the gate electrodes 36 as a mask".

Figure 17:
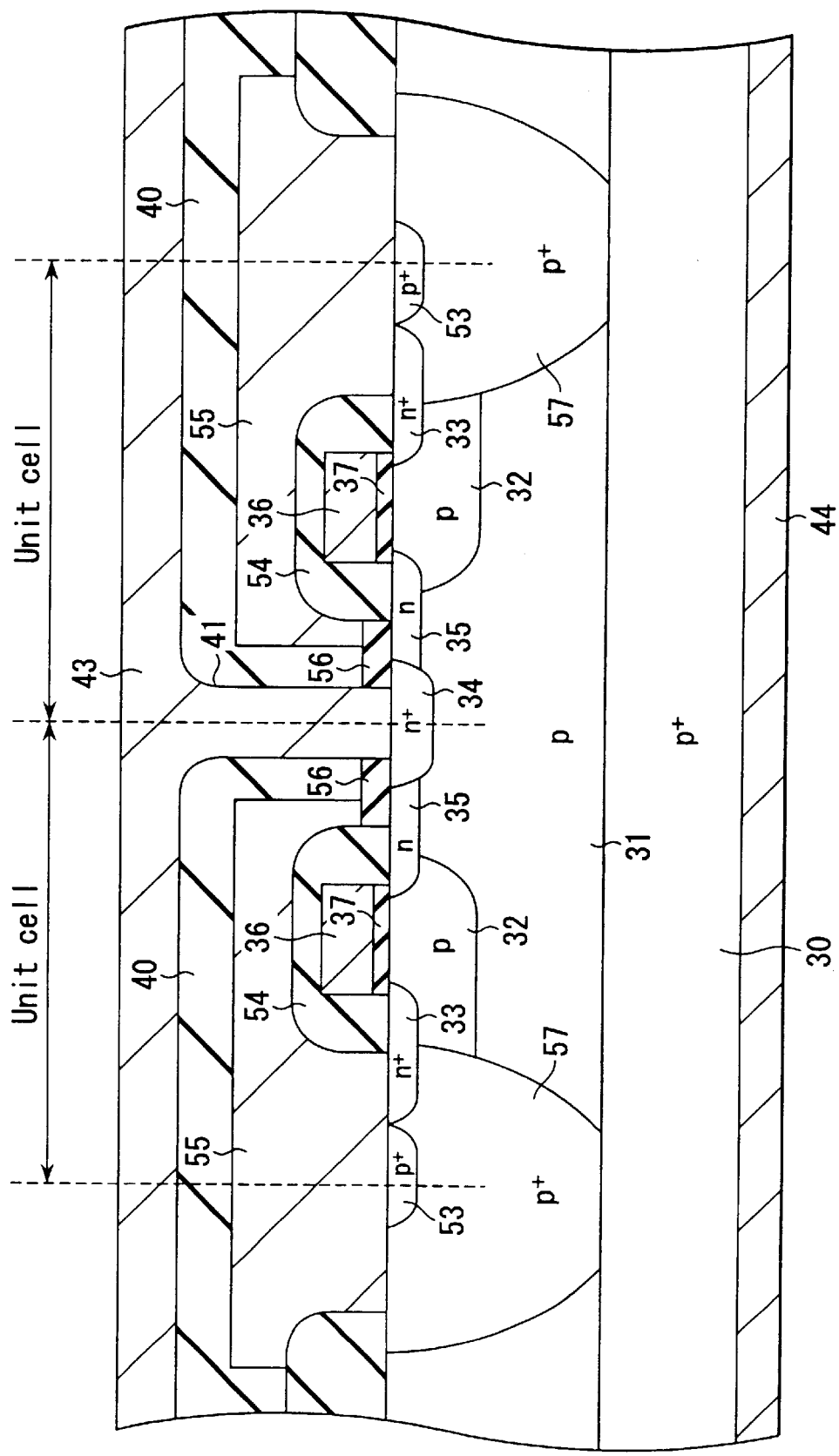
FIG. 17 is a sectional view of a MOS transistor according to the fifth embodiment of the present invention.

A MOS transistor according to the fifth embodiment of the present invention will be described next with reference to FIG. 17. FIG. 17 is a sectional view of an offset-gate-type MOS transistor.

As shown in FIG. 17, p-type body regions 32 are selectively formed in the surface region of a p-type epitaxially grown layer 31 on a p⁺-type silicon substrate 30. An n⁺-type source region 33 is formed in the surface region of each body region 32. A p⁺-type contact layer 53 is formed in contact with each source region 33. An n⁺-type drain region 34 is formed in the surface region of the p-type epitaxially grown layer 31 between the adjacent body regions 32. N-type drift regions 35 are formed from the drain region 34 along the body regions 32 while being separated from the body regions 32. A gate electrode 36 is formed on each source region 32 between the source region 33 and the drift region 33. A gate insulating film 37 is formed on the gate insulating film 37. An insulating film 54 surrounds the upper and side surfaces of each gate electrode 36. A source electrode 55 is formed on the source region 33 and contact layer 53 to electrically short-circuit them. The source electrode 55 surrounds the upper and side surfaces of the insulating film 54 that covers the gate electrode 36. The source electrode 55 is insulated from the drain region 34 and drift region 35 by an insulating film 56. That is, the upper and side surfaces of the gate electrode 36 are surrounded by the source electrode 55. The insulating film 56 may be part of the insulating film 54. A dielectric interlayer 40 is formed on the epitaxially grown layer 31 to cover the source electrodes 55 and insulating films 56. A contact hole 41 is formed to extend from the surface of the dielectric interlayer 40 to the drain region 34 through the insulating film 56. A drain electrode (drain interconnection layer) 43 fills the contact hole 41 and extends on the dielectric interlayer 40. The drain interconnection layer 43 on the dielectric interlayer 40 extends on the gate electrodes 36 and source electrodes 55 (the drain interconnection layer 43 overlaps the gate electrodes 36 and source electrodes 55). A p⁺-type reach through layer 57 is formed in the p-type epitaxially grown layer 31 from a portion immediately under each source electrode 55 to the p⁺-type silicon substrate 30. With this structure, each source region 33 is electrically connected to the p⁺-type silicon substrate 30. A source electrode 44 is formed on the lower surface of the p⁺-type silicon substrate 30.

In the MOS transistor shown in FIG. 17, when a forward voltage is applied between the source and the drain and to the gate, a channel is formed in the upper surface of the body region 32 between the source region 33 and the drain region 34. A current that flows from the drain region 34 to the source region 33 through the drift region 35 and channel flows into the source electrode 44 through the source electrode 55, contact layer 53, reach through layer 57, and p⁺-type silicon substrate 30.

With the MOS transistor having the above structure, the following effect (6) can be obtained.

(6) The feedback capacitance of the MOS transistor can be decreased.

In the structure shown in FIG. 17, the source electrode 55 is inserted between each gate electrode 36 and the drain interconnection layer 43 which is present immediately above the gate electrode 36 and on the side portion of the gate electrode 36. The source electrode 55 is normally fixed at the ground potential. As a result, since the source electrode 55 serves as a shield, the parasitic capacitance between the gate and the drain of the MOS transistor can be reduced. If the parasitic capacitance can be reduced, a power loss in high-frequency operation such as high-speed switching of the MOS transistor can be reduced.

Additionally, the effect (3) described in the first embodiment can be obtained. That is, wire bonding in the assembly step is unnecessary. For this reason, the problem of a parasitic inductance generated by bonding wires can be solved. In addition, the assembly step can be simplified. Furthermore, if the source region 33 and p⁺-type silicon substrate 30 are connected by the heavily doped reach through layer 57, the resistance of the MOS transistor can be decreased.

In the MOS transistor according to this embodiment, the contact hole 41 is filled with the drain electrode 43 that also serves as a drain interconnection layer. However, the drain electrode 43 may be formed by filling the contact hole 41 with a metal plug or the like, and then, a metal interconnection layer serving as a drain interconnection layer may be newly formed on the dielectric interlayer 40.

Figure 18:
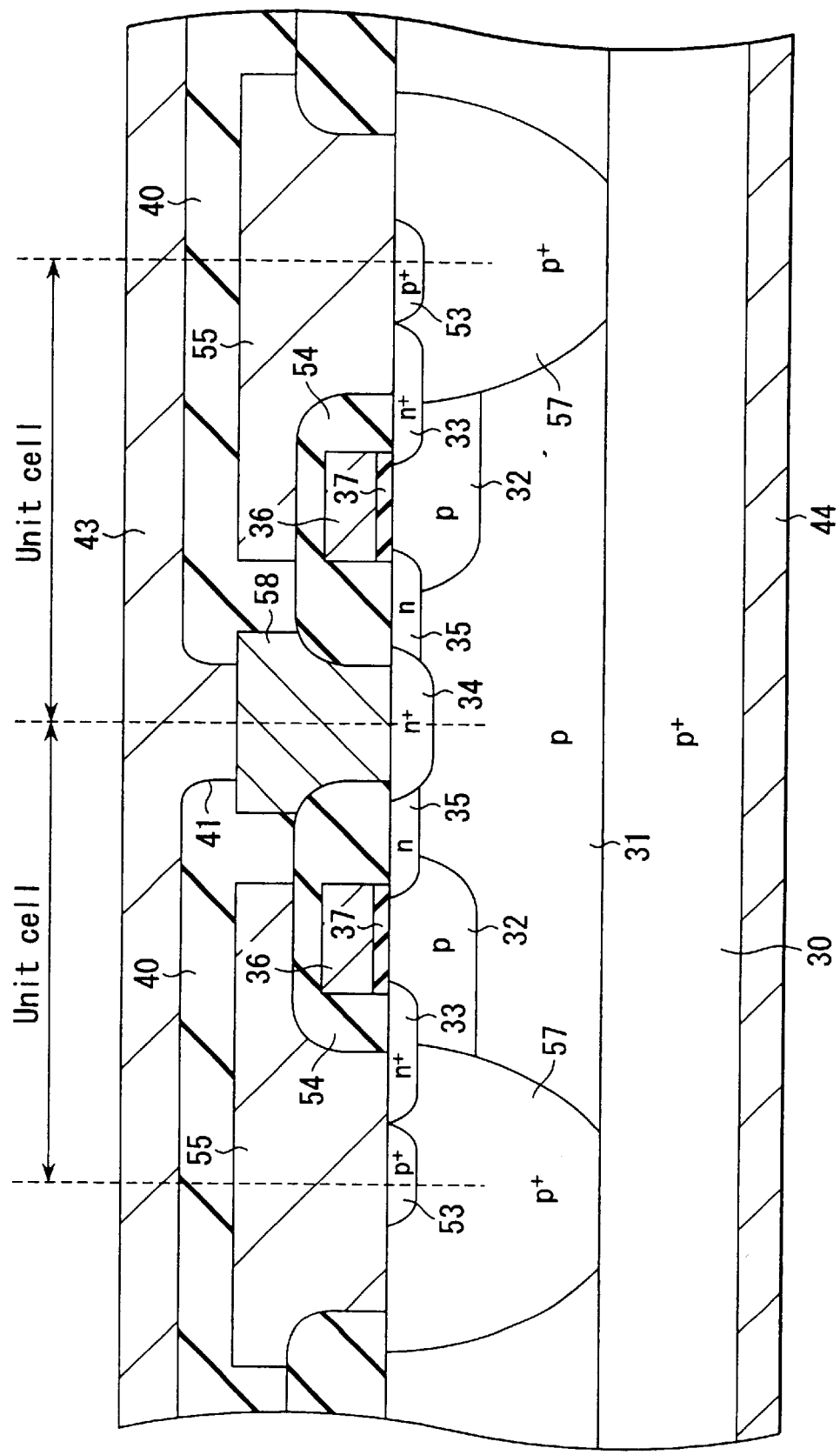
FIG. 18 is a sectional view of a MOS transistor according to the sixth embodiment of the present invention.

A MOS transistor according to the sixth embodiment of the present invention will be described next with reference to FIG. 18. FIG. 18 is a sectional view of an offset-gate-type MOS transistor. The structure in a p-type epitaxially grown layer 31 is the same as in the fifth embodiment, and a description thereof will be omitted. Only the structure on the p-type epitaxially grown layer 31 will be described.

A gate insulating film 37 is formed on each body region 32 between a source region 33 and a drift region 35. A gate electrode 36 is formed on the gate insulating film 37. The gate electrode 36 is surrounded by a gate insulating film 54. A source electrode 55 is formed on the source region 33 and contact layer 53 to electrically short-circuit them. The source electrode 55 extends to a portion immediately above the gate electrode 36. A part of the insulating film 54 is interposed between the gate electrode 36 and source electrode 55. A drain electrode 58 is formed on a drain region 34. A dielectric interlayer 40 is formed on the epitaxially grown layer 31 to cover the source electrodes 55, drain electrode 58, and insulating films 54. A contact hole 41 is formed to extend from the surface of the dielectric interlayer 40 to the drain electrode 58. A drain interconnection layer 43 fills the contact hole 41 and extends on the dielectric interlayer 40.

With the MOS transistor having the above structure, the effect (6) described in the fifth embodiment can be obtained. That is, in the MOS transistor according to this embodiment, the source electrode 55 is inserted between each gate electrode 36 and the drain interconnection layer 43 which is present immediately above the gate electrode 36. The source electrode 55 is normally fixed at the ground potential. Since the source electrode 55 serves as a shield, the parasitic capacitance between the gate and the drain of the MOS transistor can be reduced.

The sixth embodiment can be relatively easily practiced as compared to the fifth embodiment. This is because the drain electrode 58 can be formed by self-alignment using the insulating film 54. This structure is suitable for miniaturized semiconductor device. The drain electrode 58 and drain electrode 43 may be integrated, as shown in FIG. 17.

Figure 19:
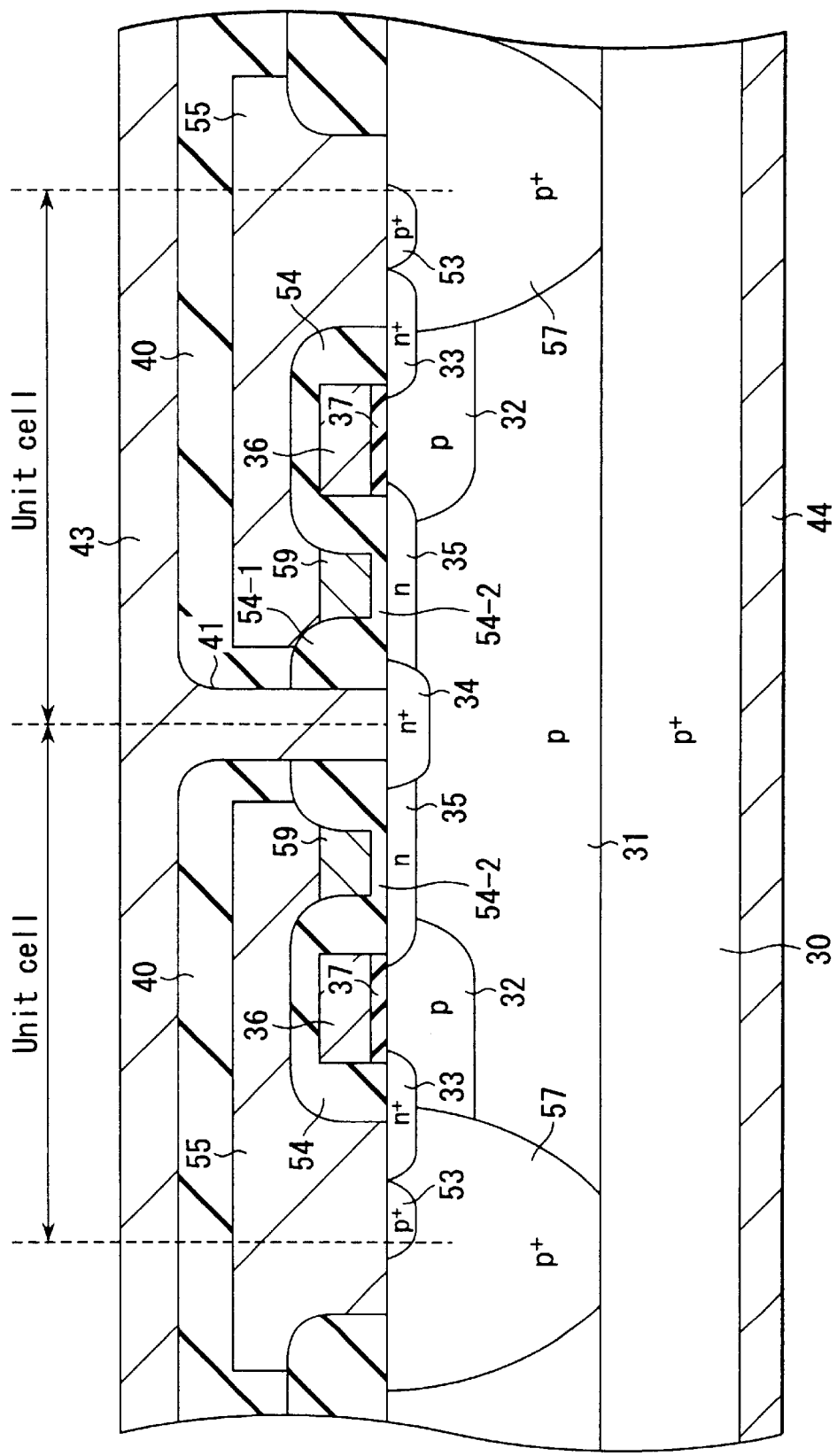
FIG. 19 is a sectional view of a MOS transistor according to the seventh embodiment of the present invention.

A MOS transistor according to the seventh embodiment of the present invention will be described next with reference to FIG. 19. FIG. 19 is a sectional view of an offset-gate-type MOS transistor. The structure in a p-type epitaxially grown layer 31 is the same as in the fifth embodiment, and a description thereof will be omitted. Only the structure on the p-type epitaxially grown layer 31 will be described.

A gate insulating film 37 is formed on each body region 32 between a source region 33 and a drift region 35. A gate electrode 36 is formed on the gate insulating film 37. The gate electrode 36 is surrounded by a gate insulating film 54. An insulating film 54-1 having the same height as that of the insulating film 54 is formed between the adjacent gate electrodes 36 while being separated from the insulating films 54 by a predetermined distance. An insulating film 54-2 thinner than the insulating films 54 and 54-1 is also formed on each drift region 35 between the adjacent insulating films 54 and 54-1. A polysilicon film 59 is formed on each insulating film 54-2. A source electrode 55 is formed on the source region 33 and contact layer 53 to electrically short-circuit them. The source electrode 55 extends from the upper surface of the insulating film 54 that covers the gate electrode 36 onto the polysilicon film 59. The source electrode 55 is also electrically connected to the polysilicon film 59. A dielectric interlayer 40 is formed on the epitaxially grown layer 31 to cover the source electrodes 55 and insulating film 54-1. A contact hole 41 is formed to extend from the surface of the dielectric interlayer 40 to a drain region 34 through the insulating film 54-1. A drain electrode (drain interconnection layer) 43 fills the contact hole 41 and extends on the dielectric interlayer 40.

With the MOS transistor having the above structure, the effect (6) described in the fifth embodiment can be obtained. That is, in the MOS transistor according to this embodiment, the source electrode 55 is inserted between each gate electrode 36 and the drain interconnection layer 43 which is present immediately above the gate electrode 36. The source electrode 55 is normally fixed at the ground potential. In addition, the polysilicon film 59 connected to the source electrode 55 and set at the same potential at that of the source electrode 55 is formed on the side surface of each gate electrode 36. Since the source electrode 55 and polysilicon film 59 serve as a shield, the parasitic capacitance between the gate and the drain of the MOS transistor can be reduced.

The seventh embodiment can be relatively easily practiced as compared to the fifth embodiment. This is because the material of the gate electrodes 36 can also be used to form the polysilicon films 59. That is, the gate electrodes are formed by forming a polysilicon film on the gate insulating film 37 and patterning the polysilicon film into a gate electrode pattern. When the polysilicon film is patterned, the polysilicon film is left at a portion adjacent to each gate electrode. As a result, the polysilicon films 59 can be formed.

The drain electrode 58 may be formed by filling the contact hole 41 with a metal plug or the like, and then, the drain interconnection layer 43 may be newly formed on the dielectric interlayer 40, as shown in FIG. 18 described in the sixth embodiment. The polysilicon film 59 may be a metal interconnection layer formed in a step different from that for the gate electrodes. The polysilicon film 59 can be formed from any other conductive film that is set at the same potential as that of the source electrode.

The source electrode 55 need not always be extracted onto the portion immediately above the gate electrode 36, as in the fifth to seventh embodiments. Such structures will be described with reference to FIGS. 20A and 20B as the first and second modifications to the fifth to seventh embodiments.

Figure 20A:
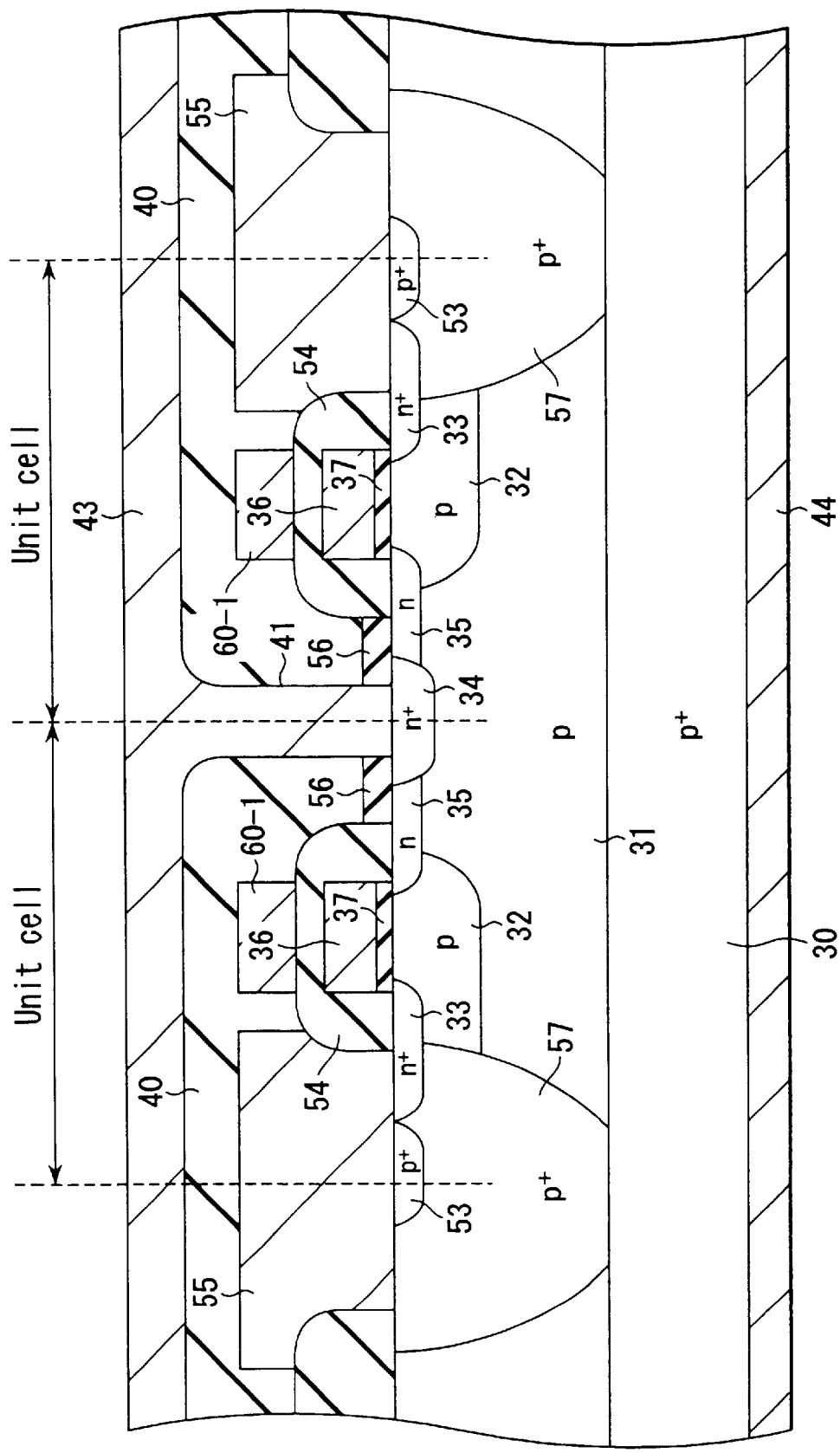
FIGS. 20A and 20B are sectional views of MOS transistors according to the first and second modifications to the fifth to seventh embodiments of the present invention.

FIG. 20A is a sectional view of a MOS transistor according to the first modification to the fifth to seventh embodiments of the present invention. As shown in FIG. 20A, in a MOS transistor according to this modification, a conductive film 60-1 is formed in place of the source electrode 55 immediately above each gate electrode 36. The same potential as that of the source electrode 55 is applied to the conductive film 60-1.

Figure 20B:
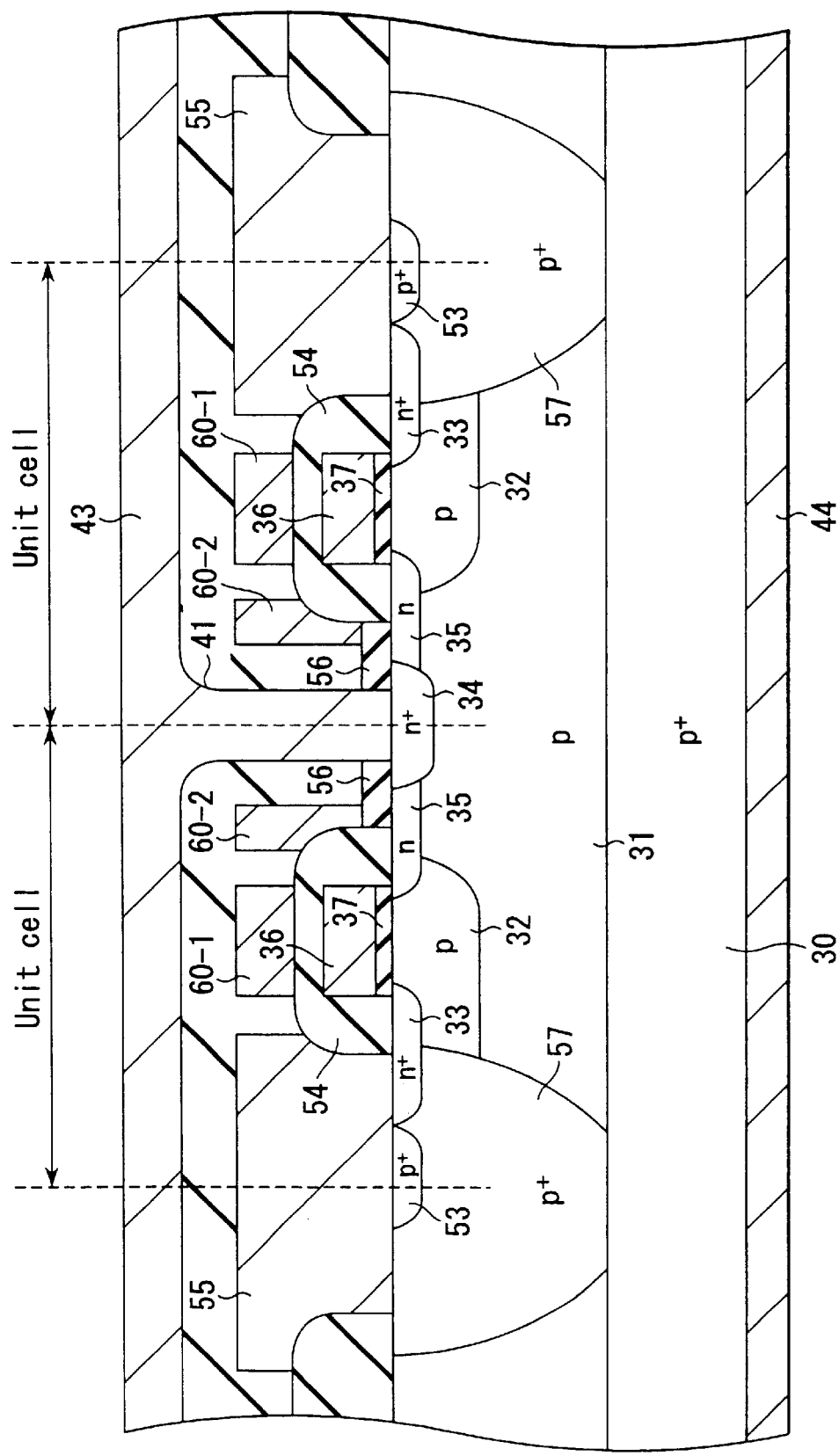

FIG. 20B is a sectional view of a MOS transistor according to the second modification to the fifth to seventh embodiments of the present invention. As shown in FIG. 20B, in a MOS transistor according to this modification, in the structure shown in FIG. 20A described in the first modification, a conductive film 60-2 is formed between the drain electrode 43 and the sidewall of each gate electrode 36. The same potential as that of the source electrode 55 is applied to the conductive film 60-2.

When a region at the same potential as that of the source electrode 55 is formed near the gate electrode 36, the same effect as in the fifth to seventh embodiments can be obtained. The conductive films 60-1 and 60-2 need not always be at the same potential as that of the source electrode 55. For example, even when the conductive films are set at a predetermined potential between the source potential and the drain potential, the same effect as described above can be obtained.

Figure 21A:
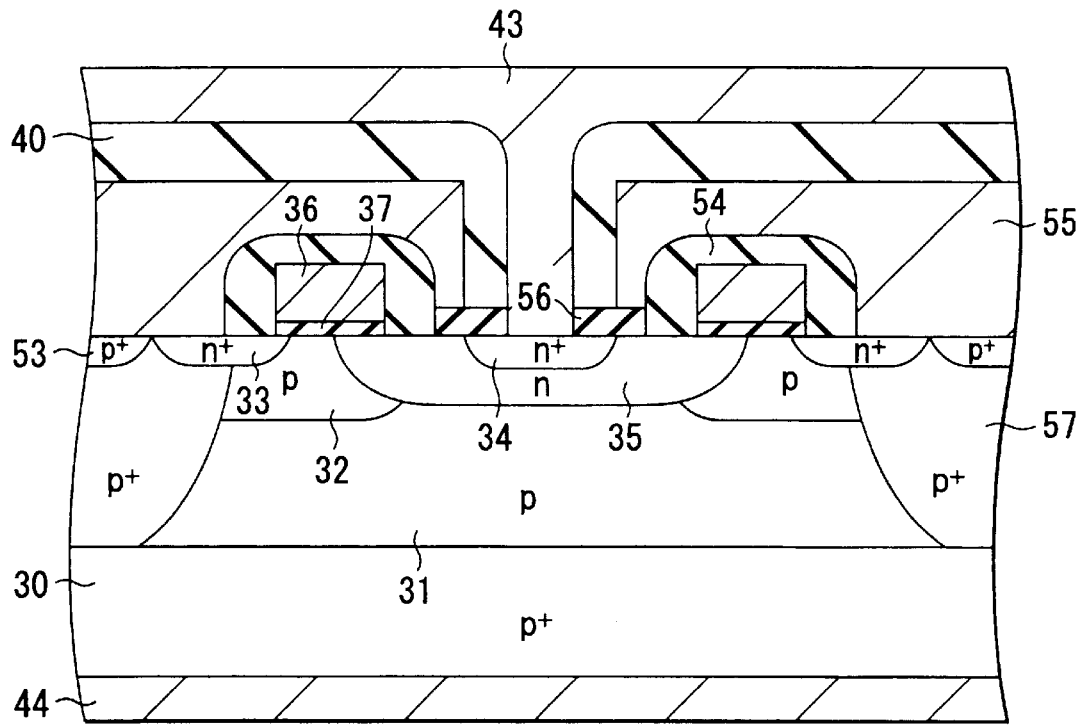
FIGS. 21A to 21C are sectional views of MOS transistors according to the third to fifth modifications to the fifth to seventh embodiments of the present invention.
Figure 21B:
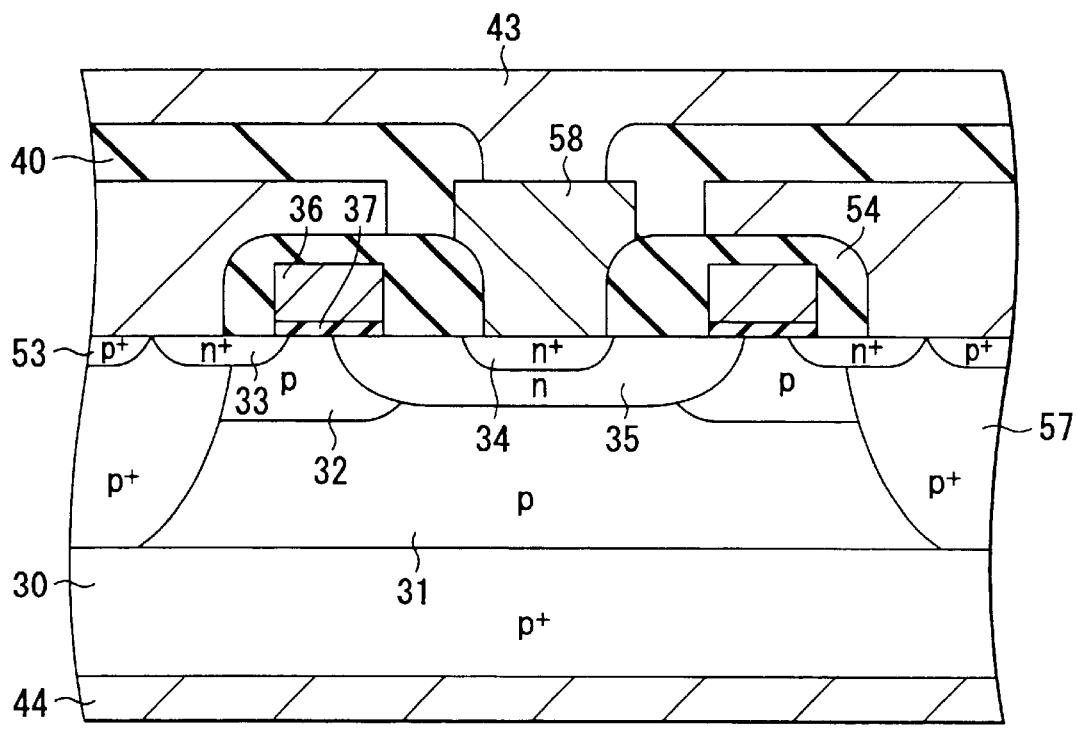
Figure 21C:
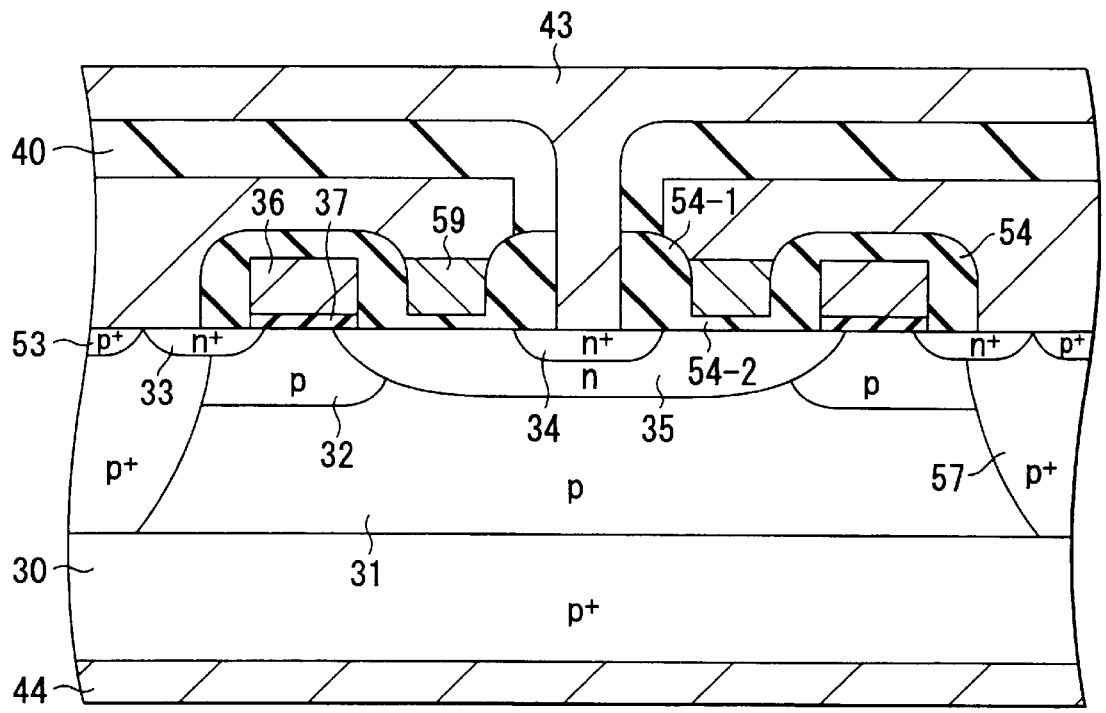

FIGS. 21A to 21C are sectional views of offset-gate-type MOS transistors according to the third to fifth modifications to the fifth to seventh embodiments.

The MOS transistors according to these modifications are offset-gate-type MOS transistors as in the fifth to seventh embodiments. However, the n-type drift region 35 is formed to surround the n$^+$-type drain region 34. In FIGS. 21A to 21C, the fifth to seventh embodiments are applied to a MOS transistor having the above structure.

Even in these modifications, the same effect as in the above embodiments can be obtained.

Figure 22A:
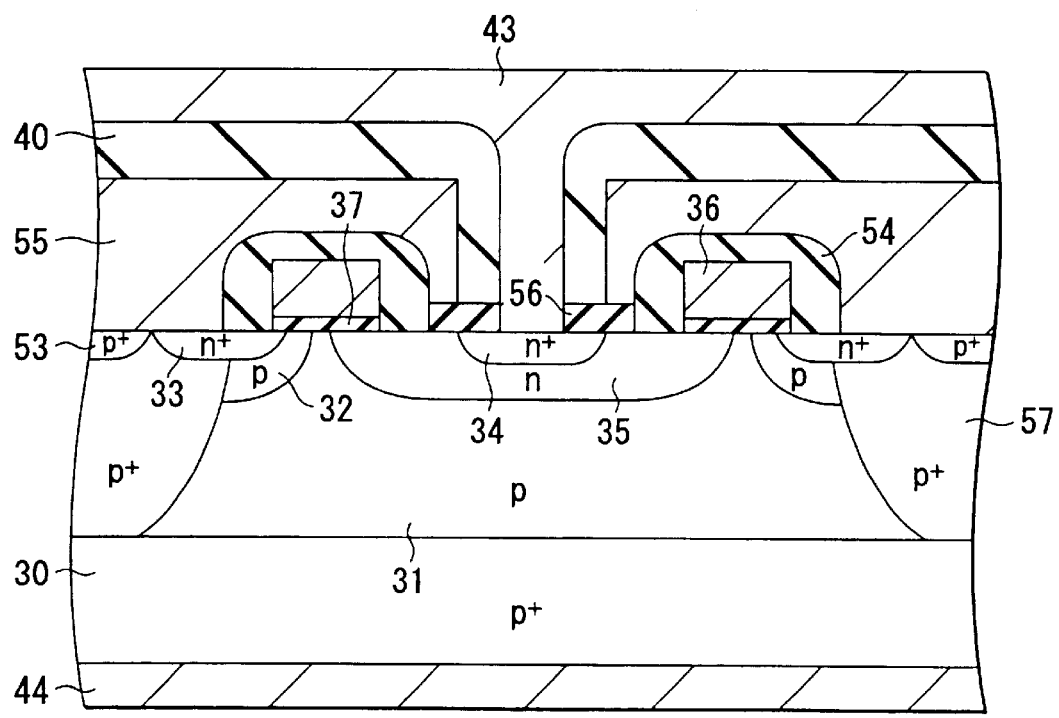
FIGS. 22A to 22C are sectional views of MOS transistors according to the sixth to eighth modifications to the fifth to seventh embodiments of the present invention.
Figure 22B:
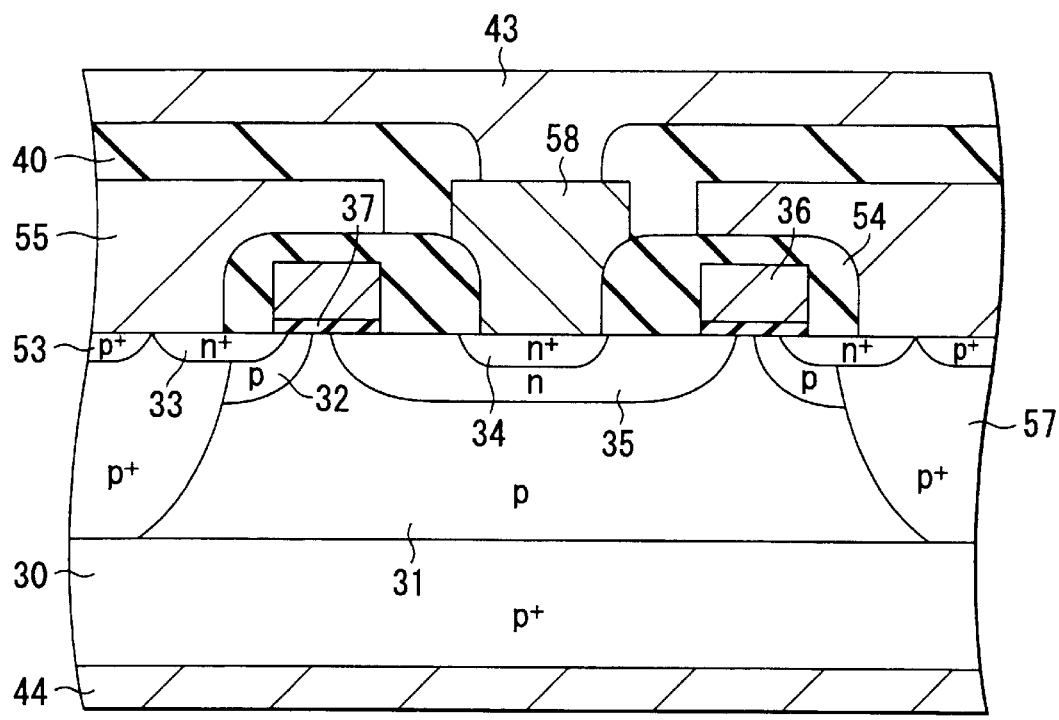
Figure 22C:
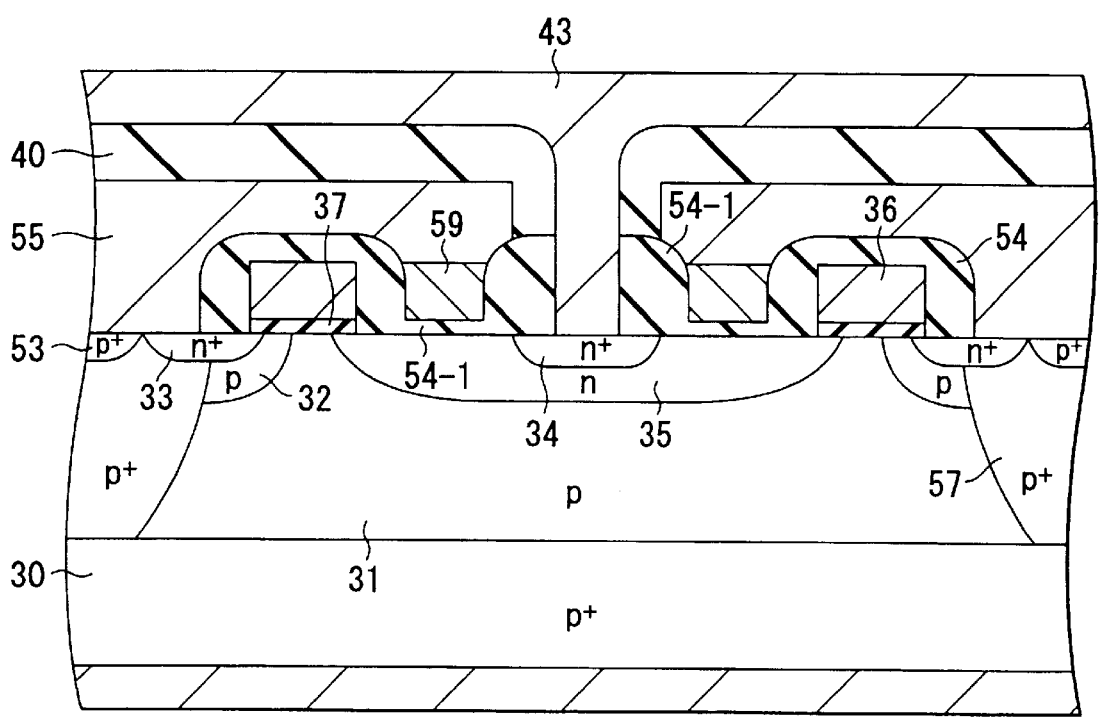

FIGS. 22A to 22C are sectional views of offset-gate-type MOS transistors according to the sixth to eighth modifications to the fifth to seventh embodiments.

The MOS transistors according to these modifications are offset-gate-type MOS transistors as in the fifth to seventh embodiments. However, the n-type drift region 35 is formed to surround the n$^+$-type drain region 34. In addition, the p-type body region 32 is separated from the drift region.

Even in these modifications, the same effect as in the above embodiments can be obtained.

Figure 23:
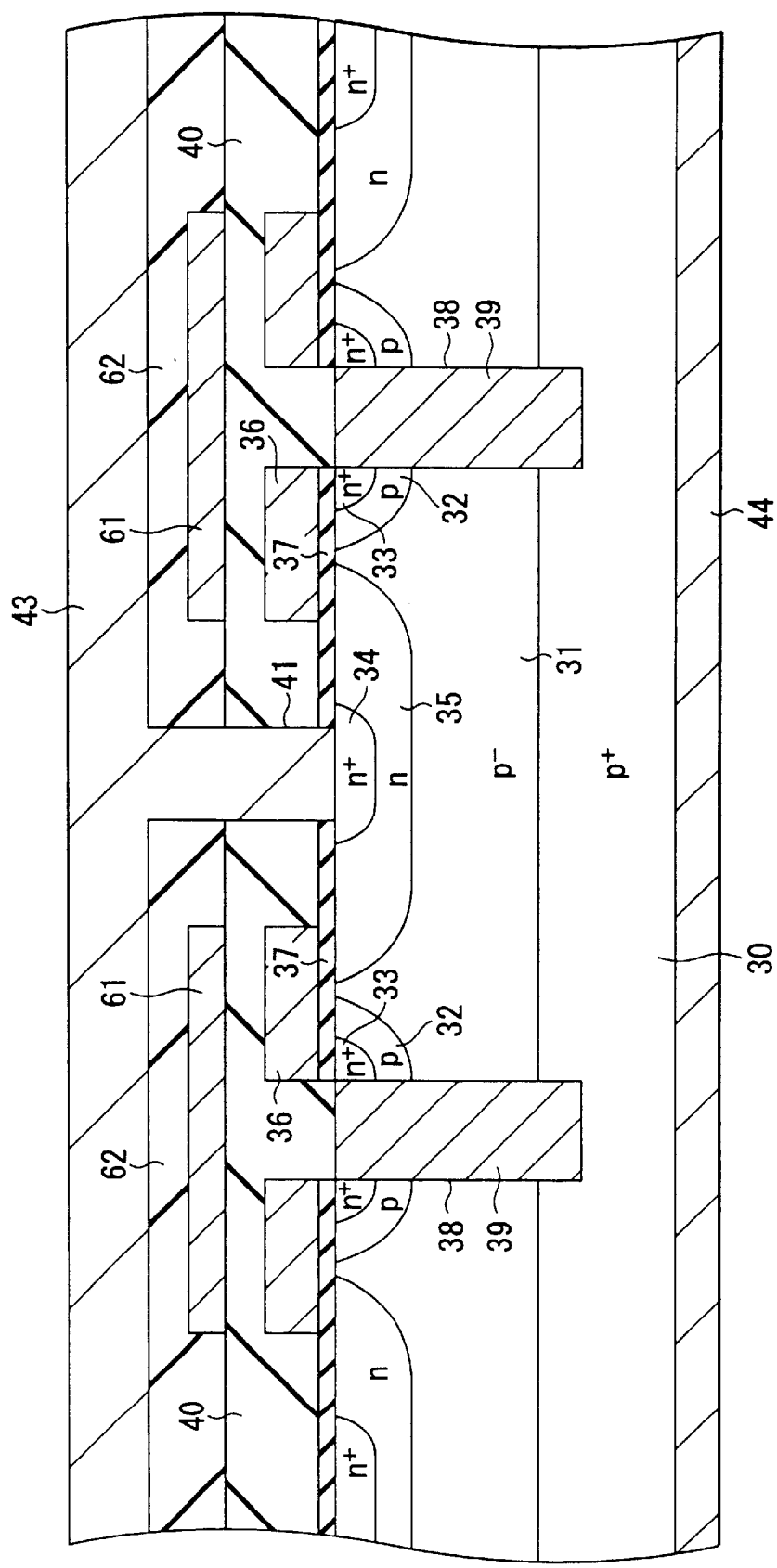
FIG. 23 is a sectional view of a MOS transistor according to the eighth embodiment of the present invention.

A MOS transistor according to the eighth embodiment of the present invention will be described next with reference to FIG. 23. FIG. 23 is a sectional view of an offset-gate-type MOS transistor.

In this embodiment, the first and fifth embodiments are combined. That is, in the structure shown in FIG. 2, a conductive film 61 is formed on a dielectric interlayer 40 immediately above gate electrodes 36. The conductive film 61 is set at the same potential as that of a source electrode 44. A dielectric interlayer 62 is formed on the dielectric interlayer 40 to cover the conductive film 61. A drain electrode 43 is formed on the dielectric interlayer 62. As a result, as shown in FIG. 23, the conductive film 61 at the same potential as that of the source electrode 44 is present between the gate electrodes 36 and the drain electrode 43.

According to the MOS transistor of this embodiment, both the effects (1) to (4) described in the first embodiment and the effect (6) described in the fifth embodiment can be obtained.

Figure 24:
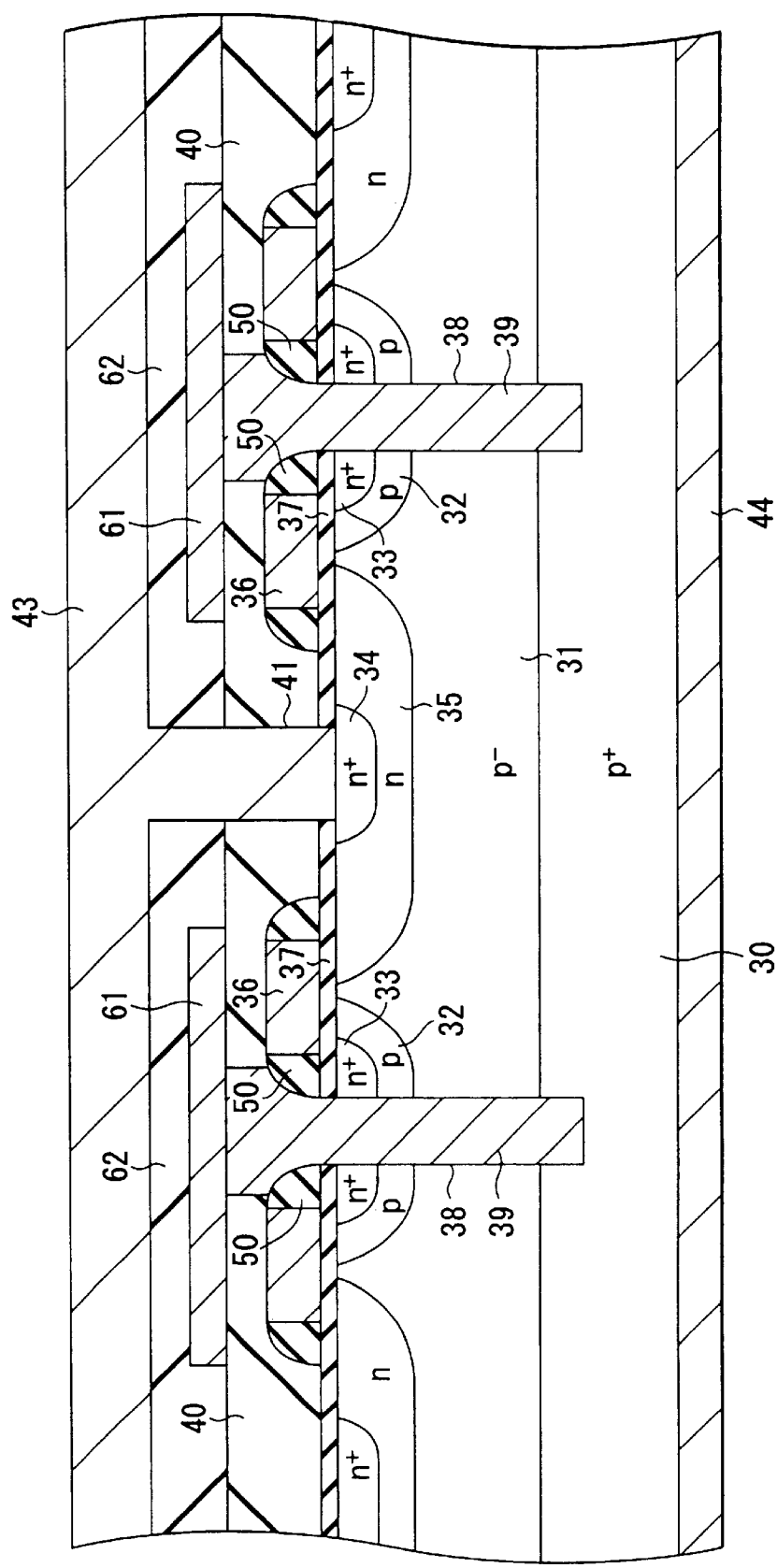
FIG. 24 is a sectional view of a MOS transistor according to a modification to the eighth embodiment of the present invention.

FIG. 24 is a sectional view of an offset-gate-type MOS transistor according to a modification to the eighth embodiment. In this modification, the second modification (FIG. 7) to the second embodiment and the fifth embodiment are combined.

As shown in FIG. 24, in the structure shown in FIG. 7, the conductive member 39 reaches the surface of the dielectric interlayer 40. The conductive film 61 is formed on the dielectric interlayer 40 immediately above the gate electrodes 36. The conductive film 61 is in contact with the conductive member 39. The dielectric interlayer 62 is formed on the dielectric interlayer 40 to cover the conductive film 61. The drain interconnection layer 43 is formed on the dielectric interlayer 62. With this structure, the trench electrode and conductive film 61 can easily be set at an equipotential.

The combinations of the first to fourth embodiments and the fifth to seventh embodiments are not limited to the structures shown in FIGS. 23 and 24. The embodiments can be freely combined.

As described above, in the MOS transistors according to the first to fourth embodiments, the source region 33 and silicon substrate 30 are electrically connected using the trench electrode. Each gate electrode 36 is laid out to be adjacent to the trench 38 such that the extended surface of one side surface becomes flush with the extended surface of the sidewall of the trench 38. Hence, the size of the MOS transistor can be reduced. In addition, since the area of the source region 33 can be reduced, the resistance value of the body region 32 becomes considerably small. Hence, the ruggedness to avalanche current of the MOS transistor can be improved.

In the first to fourth embodiments, the drift region and drain region are formed before the trench formation step. However, these regions may be formed after the trench formation step. The sequence of these steps is not particularly limited. The drift region and drain region are formed by re-diffusing the impurity-implanted layers in the annealing step to form the body region and source region. However, the drift region and drain region may be formed in another annealing step.

In the MOS transistors according to the fifth to seventh embodiments of the present invention, each gate electrode 36 is surrounded by the source electrode 55 or by the source electrode 55 and conductive films 59, 60-1, and 60-2. The same potential as that of the source electrode 55 or a predetermined potential between the source potential and the drain potential is applied to the conductive films 59, 60-1, and 60-2. For this reason, the parasitic capacitance between the gate electrode of the MOS transistor and the drain electrode and drain interconnection layer can be reduced, and the feedback capacitance can be reduced. Consequently, a power loss in high-frequency operation such as high-speed switching of the semiconductor device can be reduced.

In the fifth to seventh embodiments, an example has been described, in which a current is caused to flow to the drain region 34, drift region 35, source region 33, source electrode 55, contact layer 53, reach through layer 57, and p$^+$-type silicon substrate 30 whereby the source electrode 44 is used as an actual source electrode, and the source electrode 55 serves only as part of the current path. However, the source electrode 55 may be used as an actual source electrode. That is, in assembling the semiconductor device, an interconnection layer on the assembly substrate for supplying the source potential may be connected to the source electrode 55. The fifth to seventh embodiments can be applied not only to an offset-gate-type MOS transistor but also to any semiconductor device in which three electrodes having different potentials are present on a single surface, and a parasitic capacitance between two overlapping electrodes poses a problem.

In the MOS transistor according to the eighth embodiment of the present invention, the first to fourth embodiments and the fifth to seventh embodiments are combined, thereby obtaining all the effects of these embodiments.

Figure 25A:
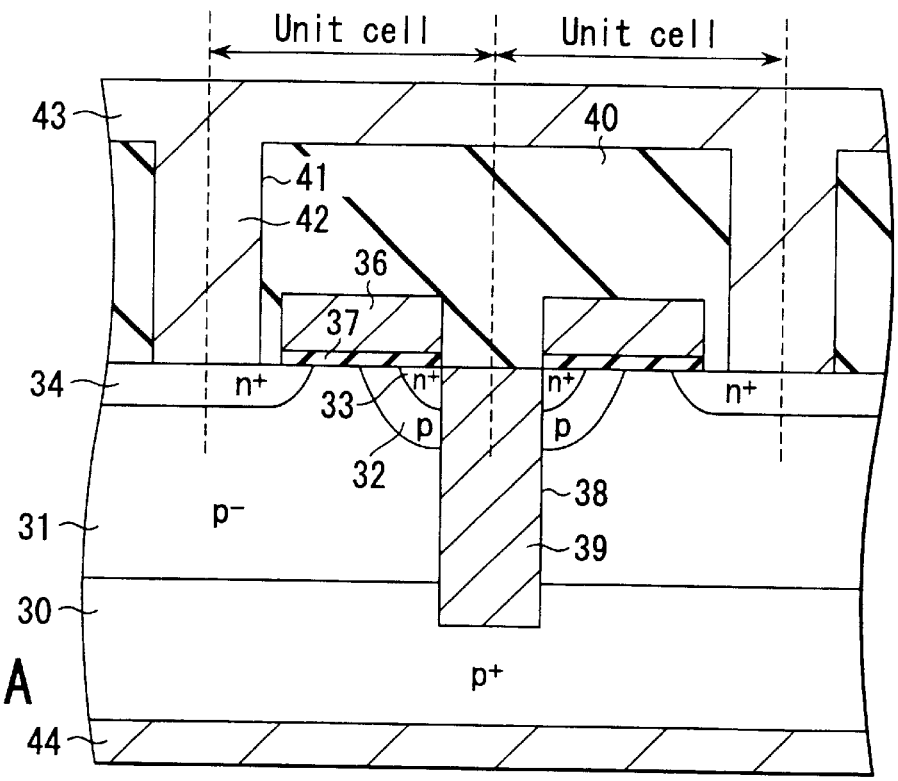
FIGS. 25A and 25B are sectional views of MOS transistors according to modifications to the first to eighth embodiments of the present invention.
Figure 25B:
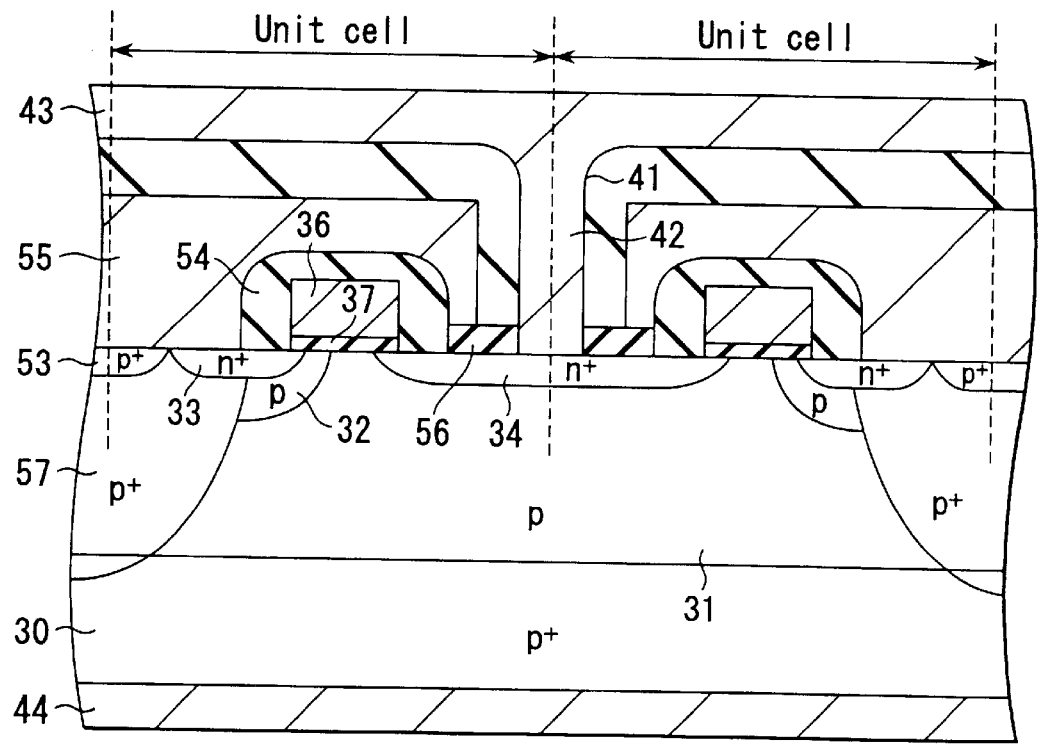

The first to eighth embodiments of the present invention can also be applied to a pMOS transistor. In this case, the n- and p-types in the above embodiments are reversed. In the above embodiments, the drift region is formed to raise the breakdown voltage of the element. However, the drift region may be omitted if no high breakdown voltage is necessary. In this case, the drain region 34 is formed such that its end portion is located immediately under the gate electrode 36, as shown in FIGS. 25A and 25B that are sectional views of MOS transistors.

The semiconductor device manufacturing methods of the above embodiments are not limited to the orders described above. The order of the steps can be exchanged as long as a degree of freedom can be ensured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a first semiconductor region having a first conductivity type;

a second semiconductor region formed on the first semiconductor region and having the first conductivity type and a resistance higher than the first semiconductor region;

a conductive member arranged in a trench formed in the second semiconductor region and having a depth from a surface of the second semiconductor region to the first semiconductor region;

a third semiconductor region formed in the surface of the second semiconductor region while being separated from the conductive member and having a second conductivity type;

a fourth semiconductor region formed in the surface of the second semiconductor region in a region between the conductive member and the third semiconductor region and having the second conductivity type, said fourth semiconductor region being in contact with the conductive member and being separated from the third semiconductor region; and a gate structure formed on the fourth semiconductor region and on the second semiconductor region between the third and fourth semiconductor regions, said gate structure having one sidewall surface flush with a sidewall surface of the trench.

2. The device according to claim 1, wherein the gate structure includes:

a gate insulating film formed on the fourth semiconductor region and on the second semiconductor region between the third and fourth semiconductor regions; and a gate electrode formed on the gate insulating film, said gate electrode having one sidewall surface flush with the sidewall surface of the trench.

3. The device according to claim 1, wherein the gate structure includes:

a gate insulating film formed on the fourth semiconductor region and on the second semiconductor region between the third and fourth semiconductor regions;

a gate electrode formed on the gate insulating film; and a sidewall insulating film formed on one sidewall surface of the gate electrode in the vicinity of the trench, said sidewall insulating film having a sidewall surface flush with the sidewall surface of the trench.

4. The device according to claim 1, further comprising:

a fifth semiconductor region formed in the surface of the second semiconductor region to surround the fourth semiconductor region and having the first conductivity type and a resistance lower than the second semiconductor region; and a sixth semiconductor region formed in a surface of the third semiconductor region and having the second conductivity type and a resistance lower than the third semiconductor region.

5. The device according to claim 4, further comprising:

a seventh semiconductor region formed in the fifth semiconductor region immediately under the fourth semiconductor region to be in contact with the conductive member and having the first conductivity type and a resistance lower than the fifth semiconductor region.

6. The device according to claim 4, further comprising:

an eighth semiconductor region formed in the second and fifth semiconductor regions to be in contact with the conductive member and having the first conductivity type and a resistance lower than the fifth semiconductor region, said eighth semiconductor region being in contact with the first and fourth semiconductor regions.

7. The device according to claim 4, further comprising:

a ninth semiconductor region formed in the second semiconductor region to be in contact with the conductive member and the fifth semiconductor region and having the first conductivity type and a resistance lower than the fifth semiconductor region, said ninth semiconductor region having a partial region overlapping the fifth semiconductor region.

8. The device according to claim 1, wherein the conductive member is a metal.

9. The device according to claim 8, wherein the metal is tungsten.

10. The device according to claim 1, wherein the conductive member is a semiconductor having the first conductivity type and a resistance lower than the second semiconductor region.

11. The device according to claim 4, further comprising:
a first electrode formed on the sixth semiconductor region; and
a second electrode formed on a lower surface of the first semiconductor region, said second electrode being electrically connected to the fourth semiconductor region by the conductive member.

12. The device according to claim 1, further comprising:
a dielectric interlayer formed on the second semiconductor region to cover the gate structure;
an interconnection layer formed on the dielectric interlayer immediately above at least the gate structure and electrically connected to the third semiconductor region; and
a conductive film arranged in the dielectric interlayer immediately above the gate structure while being separated from the gate structure and interconnection layer and having the same potential as that of the fourth semiconductor region or a predetermined potential between the third and fourth semiconductor regions.

* * * * *